(12) United States Patent
Park et al.

(10) Patent No.: US 10,706,768 B2
(45) Date of Patent: Jul. 7, 2020

(54) LUMINOUS MEMBER, METHOD OF DRIVING LUMINOUS MEMBER, NON-VOLATILE MEMORY DEVICE, SENSOR, METHOD OF DRIVING SENSOR, AND DISPLAY APPARATUS

(71) Applicant: UNIVERSITY-INDUSTRY FOUNDATION (UIF), YONSEI UNIVERSITY, Seoul (KR)

(72) Inventors: Cheolmin Park, Seoul (KR); Beomjin Jeong, Seoul (KR)

(73) Assignee: UNIVERSITY-INDUSTRY FOUNDATION (UIF), YONSEI UNIVERSITY, Seoul (KR)

(*) Notice: Subject to any disclaimer, the term of this patent is extended or adjusted under 35 U.S.C. 154(b) by 288 days.

(21) Appl. No.: 15/609,745

(22) Filed: May 31, 2017

(65) Prior Publication Data
US 2017/0352308 A1    Dec. 7, 2017

(30) Foreign Application Priority Data
Jun. 1, 2016 (KR) .................... 10-2016-0067863

(51) Int. Cl.
*G09G 3/30* (2006.01)
*H01L 51/05* (2006.01)
(Continued)

(52) U.S. Cl.
CPC ............ *G09G 3/30* (2013.01); *G09G 3/2003* (2013.01); *G09G 5/10* (2013.01); *G11C 11/221* (2013.01);
(Continued)

(58) Field of Classification Search
CPC ......... G09G 3/30; G09G 3/2003; G09G 5/10; G09G 2310/0264; H01L 51/502;
(Continued)

(56) References Cited

U.S. PATENT DOCUMENTS

2007/0210708 A1* 9/2007 Ono ................ C09K 11/574
                                                           313/509
2010/0327753 A1* 12/2010 Ebisawa ............ H01L 27/3227
                                                           315/149
(Continued)

FOREIGN PATENT DOCUMENTS

JP          07-307504       11/1995
JP          2003-332078     11/2003
(Continued)

OTHER PUBLICATIONS

Office Action dated Sep. 10, 2018 corresponding to Korean Application No. 10-2016-0067863, 5 pages.
(Continued)

*Primary Examiner* — Kent W Chang
*Assistant Examiner* — Andrew Lee

(57) ABSTRACT

Provided are a luminous member, a method of driving the luminous member, a non-volatile memory device, a sensor, a method of driving the sensor, and a display apparatus. The luminous member includes a first electrode; a second electrode facing the first electrode; an emission layer, which is disposed on a main surface of the first electrode and emits light by power applied between the first electrode and the second electrode; and a ferrodielectric layer disposed between the emission layer and the second electrode, wherein AC power applied to the luminous member is controlled based on polarity or magnitude of a residual polarization generated in the ferrodielectric layer, thereby adjusting emission characteristics of the emission layer.

20 Claims, 20 Drawing Sheets

(51) Int. Cl.
| | | |
|---|---|---|
| H01L 51/50 | (2006.01) | |
| G11C 11/22 | (2006.01) | |
| H05B 45/14 | (2020.01) | |
| G09G 3/20 | (2006.01) | |
| G09G 5/10 | (2006.01) | |
| G11C 13/04 | (2006.01) | |
| H01L 27/15 | (2006.01) | |
| H01L 27/32 | (2006.01) | |
| H01L 31/167 | (2006.01) | |
| H01L 33/00 | (2010.01) | |
| H01L 33/26 | (2010.01) | |
| H01L 33/42 | (2010.01) | |
| H01L 33/44 | (2010.01) | |
| H01L 51/52 | (2006.01) | |
| H01L 51/00 | (2006.01) | |

(52) U.S. Cl.
CPC ......... *G11C 13/047* (2013.01); *H01L 27/156* (2013.01); *H01L 27/3227* (2013.01); *H01L 27/3244* (2013.01); *H01L 27/3281* (2013.01); *H01L 31/167* (2013.01); *H01L 33/0008* (2013.01); *H01L 33/26* (2013.01); *H01L 33/42* (2013.01); *H01L 33/44* (2013.01); *H01L 51/0591* (2013.01); *H01L 51/502* (2013.01); *H01L 51/5012* (2013.01); *H01L 51/5088* (2013.01); *H01L 51/5206* (2013.01); *H01L 51/5234* (2013.01); *H01L 51/5293* (2013.01); *H05B 45/14* (2020.01); *G09G 2310/0264* (2013.01); *H01L 51/0037* (2013.01); *H01L 51/0048* (2013.01); *H01L 2251/301* (2013.01); *H01L 2251/303* (2013.01); *H01L 2251/308* (2013.01); *H01L 2251/564* (2013.01)

(58) Field of Classification Search
CPC ............ H01L 51/0591; H01L 51/5088; H01L 51/5012; H01L 51/5234; H01L 51/5206; H01L 51/5293; H01L 51/0048; H01L 51/0037; H01L 33/44; H01L 33/42; H01L 33/26; H01L 33/0008; H01L 27/3227; H01L 27/156; H01L 27/3281; H01L 27/3244; H01L 31/167; H01L 2251/303; H01L 2251/564; H01L 2251/301; H01L 2251/308; G11C 11/221; G11C 13/047; H05B 33/0848

See application file for complete search history.

(56) References Cited

U.S. PATENT DOCUMENTS

| | | | | |
|---|---|---|---|---|
| 2012/0161160 | A1* | 6/2012 | Tsutsui ............... | H01L 51/5262 257/79 |
| 2013/0300677 | A1* | 11/2013 | Kim ..................... | G06F 3/0414 345/173 |
| 2014/0361281 | A1* | 12/2014 | Carroll ............... | H01L 51/0036 257/40 |
| 2016/0240821 | A1* | 8/2016 | Carroll .................. | H01L 51/50 |

FOREIGN PATENT DOCUMENTS

| | | |
|---|---|---|
| KR | 10-1999-0076085 | 10/1999 |
| KR | 10-2001-0022760 | 3/2001 |
| KR | 10-2006-0014442 | 2/2006 |
| KR | 10-0796800 | 1/2008 |
| KR | 10-2010-0090318 | 8/2010 |
| WO | WO 1999-065051 | 12/1999 |

OTHER PUBLICATIONS

Office Action dated May 1, 2018 corresponding to Korean Application No. 10-2016-0067863, 5 pages.

* cited by examiner

LUMINOUS MEMBER, METHOD OF DRIVING LUMINOUS MEMBER, NON-VOLATILE MEMORY DEVICE, SENSOR, METHOD OF DRIVING SENSOR, AND DISPLAY APPARATUS

CROSS-REFERENCE TO RELATED APPLICATION

This application claims priority of Korean Patent Application No. 10-2016-0067863, filed on Jun. 1, 2016, in the KIPO (Korean Intellectual Property Office), the disclosure of which is incorporated herein entirely by reference.

BACKGROUND OF THE INVENTION

Field of the Invention

The present disclosure relates to an electroluminescence technique, and more particularly, to luminous member using electroluminescence effect, method of driving the luminous member, non-volatile memory device, sensor, method of driving the sensor, and display apparatus.

Description of the Related Art

It is expected that human-oriented information processing apparatuses will be continuously developed, and at the center of such technology development, it is expected that a demand for memory devices for processing information will further increase. Furthermore, as the age of smart phone comes, demands for smart sensors and flexible display devices are rapidly increasing for safety, convenience, environmental protection, health, and productivity and efficiency of mobile manufacturing.

Such Memory devices, smart sensors and flexible display devices are required to have multifunctionality and highly efficiency in various fields, such as smart phones, wearable devices, automobiles, PCs, home appliances, and medical devices. In particular, it is required to develop a new concept memory device, smart sensor, or display device optimized for requirements of various devices including accuracy, precision, safety, reliability, life cycle, and low power consumption.

Currently, researches are being made on organic memory devices and organic light-emitting devices, but it is still necessary to improve memory storage capability, sensing efficiency, or display quality. In recent years, electroluminescent (EL) devices that emit light in response to electric power input are being spotlighted for improving memory storage capability, sensing efficiency, or display quality.

Electroluminescent devices may be classified into an inorganic electroluminescent device using an inorganic compound as a light-emitting substance and an organic electroluminescent device using an organic compound as a light-emitting substance. A display device using such an electroluminescent device exhibits characteristics including high-speed response, high contrast, and wide viewing angle. An organic electroluminescent device exhibits a low driving voltage and, when used in a thin film transistor (TFT) active matrix display device, exhibits wide gradations. However, such a device is sensitive to humidity and has a short lifespan. On the other hand, an inorganic electroluminescent element is easier to manufacture than an organic electroluminescent element, because a light-emitting substance is formed of an inorganic material. Although an inorganic electroluminescent device has an additional advantage of a long lifespan, a high voltage is required for light emission, and thus the inorganic electroluminescent device is generally driven as a passive matrix type display device instead of a TFT active matrix type display device. In such an electroluminescent device, the TFT active matrix type display device is preferable to secure various emission characteristic for various applications of the electroluminescent device.

SUMMARY OF THE INVENTION

Provided is a luminous member capable of easily adjusting emission characteristics of an emission layer, thereby providing various emission characteristics and various applicabilities.

Provided is a method of driving a luminous member having the above-stated advantages.

Provided is a non-volatile memory device including a luminous member having the above-stated advantages.

Provided is a sensor including a luminous member having the above-stated advantages.

Provided is a method of driving a sensor having the above-stated advantages.

Provided is a display device including a luminous member having the above-stated advantages.

Additional aspects will be set forth in part in the description which follows and, in part, will be apparent from the description, or may be learned by practice of the presented embodiments.

According to an aspect of an embodiment, a luminous member includes a first electrode; a second electrode facing the first electrode; an emission layer, which is disposed on a main surface of the first electrode and emits light by power applied between the first electrode and the second electrode; and a ferrodielectric layer disposed between the emission layer and the second electrode, wherein AC power applied to the luminous member is controlled based on polarity or magnitude of a residual polarization generated in the ferrodielectric layer, thereby adjusting emission characteristics of the emission layer.

The luminous member may further include a carrier injecting layer, which is disposed between the emission layer and the ferrodielectric layer and injects field induced carriers to the emission layer.

The first electrode may inject direct carriers to the emission layer.

The ferrodielectric layer may include at least one of polyvinylidene fluoride (PVDF), copolymers of vinylidene fluoride and ethylene trifluoride, P(VDF-TrFE), copolymers of vinylidene cyanide and vinyl acetate (VDCN-VAc), nylon-11, polyurea-9, polyvinylchloride (PVC), polyacrylonitrile (PAN), poly(phthalazinone ether nitrile) (PPEN), barium tantalate, yttruum oxide, barium titanate, tantalum oxide, titanic acid strontium, and zirconium oxide may be employed.

The emission layer may include at least one of zinc sulfide, calcium sulfide, calcium selenium sulfide, calcium sulfide yttrium, calcium sulfide strontium, strontium sulfide yttrium, calcium sulfide magnesium, zinc sulfide magnesium, strontium sulfide, calcium sulfide aluminum, calcium gallium sulfide, aluminum sulfide barium magnesium, aluminum sulfide barium, cyanoethyl cellulose, and polyvinylidene fluoride that is doped with at least one of the above-stated materials doped with at least one of magnesium, europium, samarium, chlorine, manganese, cerium, terbium, fluorine, gadolinium, thulium, copper, silver, and lead.

At least one of the first electrode and the second electrode may be a transparent electrode formed of indium tin oxide (ITO), carbon nanotube (CNT), graphene, silver (Ag) nanowire, a metal mesh, or PEDOT:PSS.

The luminous member may further include a spacer interposed between the first electrode and the emission layer, and a nano air gap may be formed between the first electrode and the emission layer due to the spacer.

According to an aspect of another embodiment, a method of driving the luminous member, the method includes generating a residual polarization in a ferrodielectric layer by applying DC power to the luminous member; and controlling AC power applied to the luminous member based on polarity or magnitude of the residual polarization generated in the ferrodielectric layer, thereby adjusting emission characteristics of an emission layer.

A carrier injecting layer for injecting field induced carriers to the emission layer may be disposed between the emission layer and the ferrodielectric layer of the luminous member.

According to an aspect of another embodiment, a non-volatile memory device includes memory cells, each of which includes the luminous member; an information writing circuit, which generates a residual polarization in a ferrodielectric layer of a first memory cell selected from among the memory cells and writes information; a light detecting unit, which converts emission characteristics of the luminous members of the respective memory cells into electric signals; and an information reading circuit, which reads out information from an electric signal of the second memory cell from among the memory cells, the electric signal converted from the emission characteristics based on light detection of the light detecting unit.

The information writing circuit may generate the residual polarization by applying DC power to the first memory cell, and the information reading circuit may read out information of the first memory cell by applying AC power to the second memory cell.

According to an aspect of another embodiment, a sensor includes the luminous member; a light detecting unit, which detects emission characteristics of light emitted by the luminous member; a control unit, which detects a change in the emission characteristics based on a detection result of the light detecting unit and controls output of an event signal based on the change of the emission characteristics; and an output unit, which outputs the event signal under the control of the control unit.

According to an aspect of another embodiment, a method of driving the sensor, the method includes, in a reference state corresponding to at least one of a first state in which a residual polarization is formed in a ferrodielectric layer and a second state in which no residual polarization is formed, detecting the emission characteristics of a luminous member by applying AC power between a first electrode and a second electrode; determining whether there is a change in the emission characteristics; and, when a change in the emission characteristics is detected, outputting an event signal based on the change in the emission characteristics.

According to an aspect of another embodiment, a display device includes pixels, each of which includes the luminous member; and a driving circuit, which controls display information based on a residual polarization of a ferrodielectric layer included in a pixel selected from among the pixels. The pixels may constitute a matrix array structure in which the pixels are arranged in horizontal directions and vertical directions.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1A:
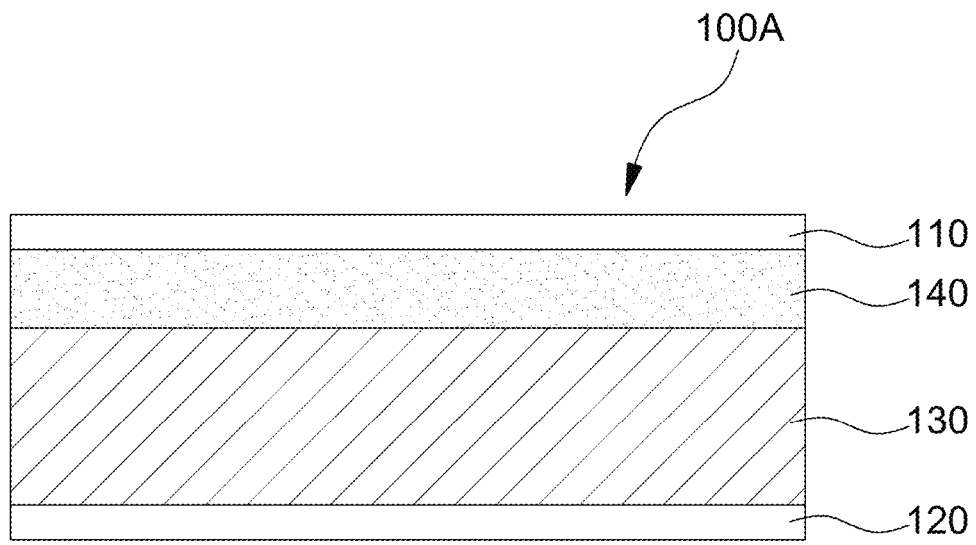
FIG. 1A is a cross-sectional diagram for describing a luminous member according to an embodiment of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 1B:
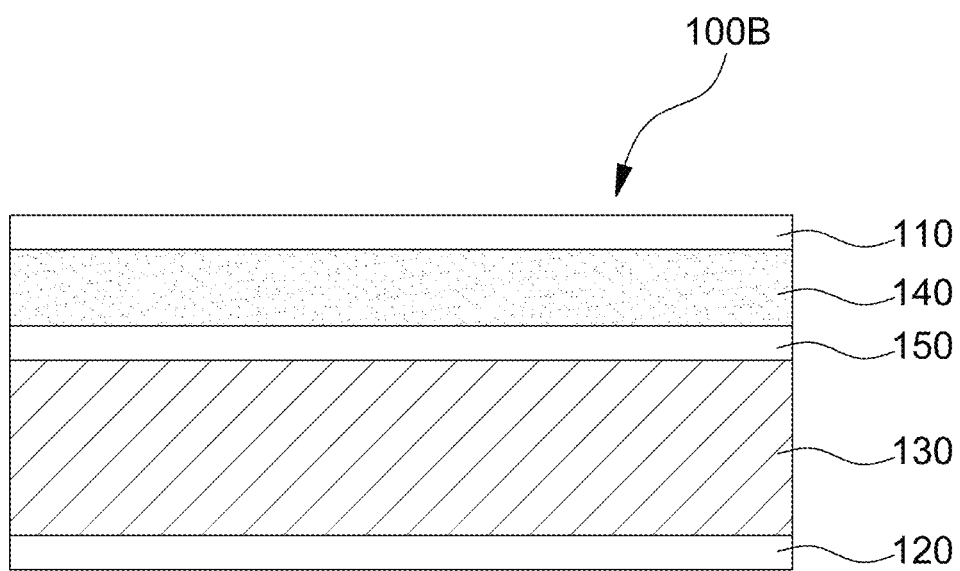
FIG. 1B is a cross-sectional diagram for describing a luminous member according to another embodiment of the present disclosure.
Figure 1C:
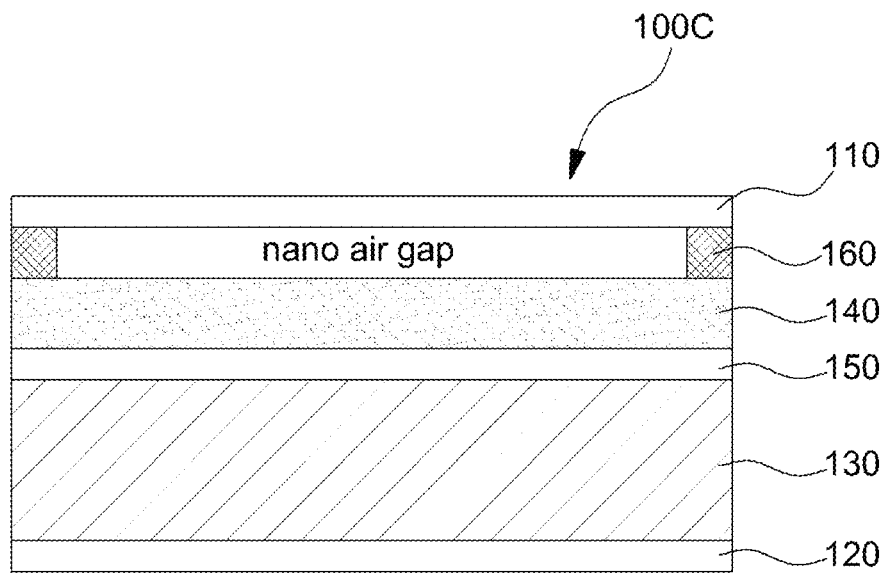
FIG. 1C is a cross-sectional diagram for describing a luminous member according to another embodiment of the present disclosure.

FIG. 1A is a cross-sectional diagram for describing a luminous member 100A according to an embodiment of the present disclosure, FIG. 1B is a cross-sectional diagram for describing a luminous member 100B according to another embodiment of the present disclosure, and FIG. 1C is a cross-sectional diagram for describing a luminous member 100C according to another embodiment of the present disclosure. In FIGS. 1A, 1B, and 1C, same reference numerals denote same components, and therefore, description for a component denoted by same reference numeral from among the components described below may be referred to in all drawings, and may not be repeatedly described.

Referring to FIG. 1A, the luminous member 100A may include a first electrode 110, a second electrode 120, a ferrodielectric layer 130, and an emission layer 140. The first electrode 110 and the second electrode 120 may be formed of a conductive material, and the first electrode 110 and the second electrode 120 may be disposed to face each other. The first electrode 110 and the second electrode 120 may form an electric field through the ferrodielectric layer 130 and the emission layer 140 as electric power is applied to the electrode 110 and 120. Furthermore, the first electrode 110 may inject direct carriers into the emission layer 140, such that the emission layer 140 emits light. The direct carriers injected from the first electrode 110 to the emission layer 140 may be electrons or holes.

The first electrode 110 and/or the second electrode 120 may be formed of a metal oxide, such as tin oxide ($SnO_2$), zinc oxide (ZnO), or a metal, such as Au, Ag, Al, Cu, Ni, Pt, Pd, Cr, Mo, W, Ta, and Nb, a polymer, such as polyaniline and polypyrrole, or carbon based conductive material. Furthermore, the first electrode 110 and/or the second electrode 120 may be a transparent electrode including, for example, indium tin oxide (ITO), carbon nanotube (CNT), graphene, silver (Ag) nanowire), a metal mesh, or PEDOT:PSS.

The first electrode 110 and/or the second electrode 120 may be formed by using a method, such as sputtering, electron beam evaporation, ion plating, inkjet coating, a dipping coating, spin coating, screen printing, and bar coating method. Furthermore, a surface treatment, such as a plasma treatment, may be performed to control the resistivity, morphology or electrical performance after film formation for the electrode 110 and 120. The thickness of the first electrode 110 and/or the second electrode 120 may be determined based on resistances and visible light transmittances of the electrodes.

The ferrodielectric layer 130 may be disposed between the second electrode 120 and the emission layer 140. The ferrodielectric layer 130 may include a material with excellent electric insulation and a high dielectric constant so as to prevent destruction of the luminous member 100A when a strong electric field is applied thereto. The ferrodielectric layer 130 may have a small number of pinholes and may be highly adhesive to the second electrode 120 and/or the emission layer 140. Furthermore, the ferrodielectric layer 130 should have a uniform film thickness and film characteristics suitable to be used for a display device and should be easily manufactured in a large size. When a high temperature treatment is necessary for fabricating a luminous member, the ferrodielectric layer 130 should have high heat resistance, and the ferrodielectric layer 130 may also be transparent to visible rays in order to extract light from the luminous member 100A.

The ferrodielectric layer 130 may include a dielectric material having a large residual polarization in response to an electric field applied thereto. Examples of such a ferrodielectric material include at least one of polyvinylidene fluoride (PVDF), copolymers of vinylidene fluoride and ethylene trifluoride, P(VDF-TrFE), copolymers of vinylidene cyanide and vinyl acetate (VDCN-VAc), nylon-11, polyurea-9, polyvinylchloride (PVC), polyacrylonitrile (PAN), poly(phthalazinone ether nitrile) (PPEN). Furthermore, as the ferrodielectric material, any one of barium tantalate, yttruum oxide, barium titanate, tantalum oxide, titanic acid strontium, and zirconium oxide may be employed.

As unlimited examples, the ferrodielectric layer 130 may be formed by using a method, such as sputtering, electron beam (EB) deposition, CVD, screen printing, and spin coating, where a formed layer may be heat treated for controlling residual polarization. Surfaces of the ferrodielectric layer 130 may be smoothly polished for efficiently transmitting light emitted from the emission layer 140 and the residual polarization of the ferrodielectric layer 130 may be controlled through thickness of the ferrodielectric layer 130.

The thickness of the ferrodielectric layer 130 may be suitably selected in consideration of residual polarization and working voltage. The ferrodielectric layer 130 generally exhibits a large coercive electric field. For example, in the case of a ferrodielectric layer 130 exhibiting a coercive electric field of 50 MV/m, when the thickness of the ferrodielectric layer 130 exceeds 4 µm, a high voltage of about 200 V is required for inversion polarization. Furthermore, when the thickness of the ferrodielectric layer 130 is small, the ferrodielectric layer 130 may be easily affected by internal defects, and thus the working voltage may be reduced. Therefore, the thickness of the ferrodielectric layer 130 may be within the range from 10 nm to 1000 nm and may have a thickness from 100 nm to 500 nm in order to exhibit good performance.

Figure 2:
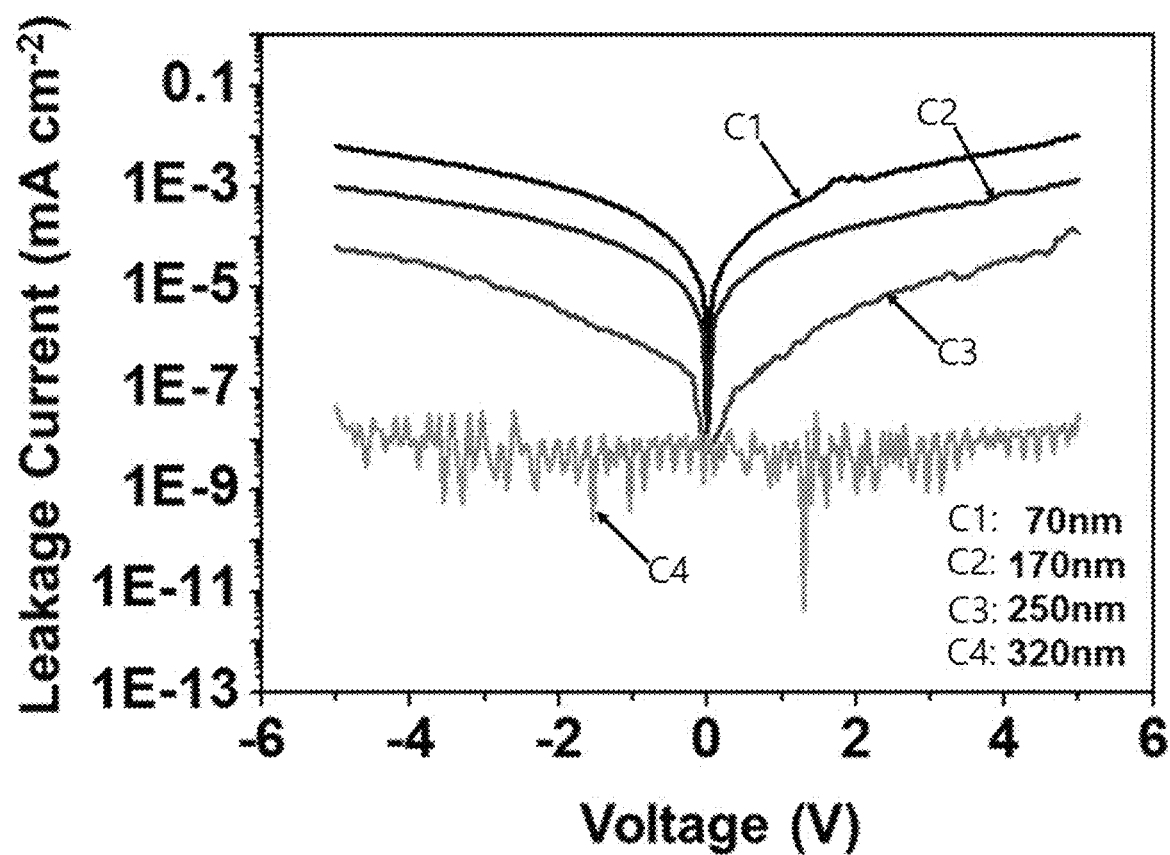
FIG. 2 is a graph showing the magnitudes of a leakage current according to thicknesses of a ferrodielectric layer.

FIG. 2 is a graph showing the magnitudes of a leakage current according to thicknesses of a ferrodielectric layer. As shown in FIG. 2, it may be seen that a leakage current decreases as the thickness increases to 70 nm (curve C1), 170 nm (curve C2), 250 nm (curve C3), and 320 nm (curve C4). Therefore, at thicknesses of the ferrodielectric layer 130 from 100 nm to 500 nm or less including the thicknesses 170 nm, 250 nm, and 320 nm, suitable leakage current characteristics may be secured, and a leakage current that may occur due to structural defects of a layer may be minimized at a thickness of about 400 nm, and thus a programming voltage may be minimized.

The ferrodielectric layer 130 exhibits hysteresis characteristics between an amount of polarization formed at the ferrodielectric layer 130 and an electric field formed at the ferrodielectric layer 130. In other words, as an electric field is formed by applying electric potential to both sides of the ferrodielectric layer 130, directions of electric dipoles in the ferrodielectric layer 130 may be arranged along an electric field direction, thereby indicating polarization of the ferrodielectric layer 130. The ferrodielectric layer 130 exhibits a large polarization at a saturation point even when a weak electric field is applied. On the other hand, polarization may be maintained even when intensity of an applied electric field is zero, and the amount of polarization of this case is referred to as residual polarization. Next, when a reverse electric field is applied, the amount of polarization becomes zero at a predetermined electric field intensity. The electric field intensity at this time corresponds to coercive electric field. When a reverse electric field is applied again, the polarization may become saturated in the reverse direction and when, the intensity of the applied electric field becomes zero again, the amount of residual dielectric polarization is reversed. The ferrodielectric layer 130 may employ a ferrodielectric material exhibiting a residual polarization greater than 3 µC/cm$^2$. As the residual polarization increases, internal polarization occurs due to charges accumulated at the interface state between the ferrodielectric layer 130 and the emission layer 140, thereby increasing the effective electric field intensity. As a result, brightness of emitted light may be increased.

Figure 3:
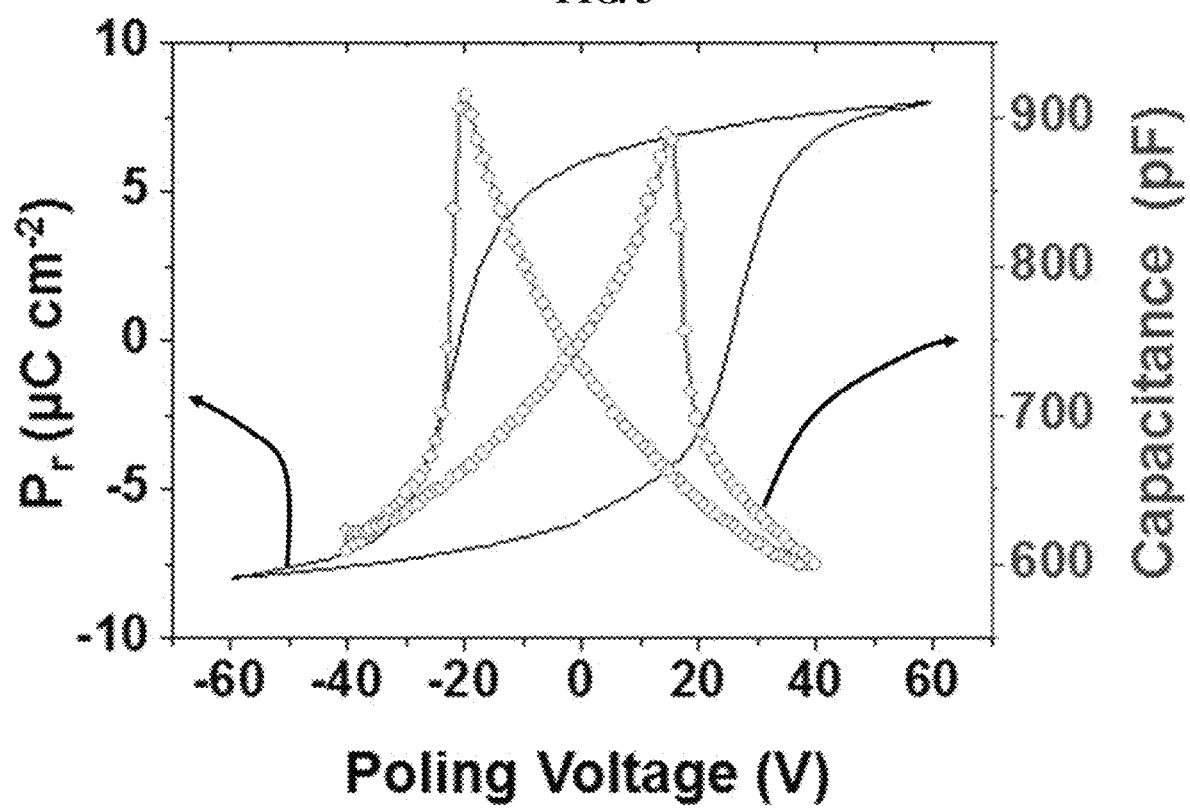
FIG. 3 is a hysteresis loop graph for describing the polarization characteristics of the ferrodielectric layer.

FIG. 3 is a hysteresis loop graph for describing the polarization characteristics of the ferrodielectric layer 130. Referring to FIG. 3, a built-in potential generated from non-volatile polarization of the ferrodielectric layer 130 may be observed from a voltage polarization characteristic curve, in other word, the hysteresis loop of the luminous member including the ferrodielectric layer 130. In the ferrodielectric layer 130 having two distinct polarization states at a zero voltage, a typical hysteresis loop may be observed due to non-volatile polarization switching. The hysteresis loop includes coercive voltages of −20 V and +26 V respective in negative and positive voltage ranges, respectively, and is completely saturated at ±60V. Coercive fields generated from the coercive voltage may be 50 MV/m and 65 MV/m in the ferrodielectric layer 130 having a thickness of about 400 nm in positive and negative voltage ranges, respectively. The ferrodielectric layer 130 having a thickness of about 400 nm may be selected to minimize a leakage current that may occur due to a structural defect of the ferrodielectric layer 130. Here, a slight asymmetric hysteresis loop is resulted from a difference in work functions of the first electrode 110 and the second electrode 120. A residual polarization of about 6.7 mC/cm$^2$ is generated at a zero voltage. Furthermore, as shown in FIG. 3, a butterfly-like capacitance behavior shows maximum capacitance values at the positive and negative coercive voltages, and ferrodielectric polarization switching may be confirmed by measuring a capacitance-voltage (CV). A CV curve exhibits similar coercive voltages in the positive and negative voltage ranges and is symmetrical.

Figure 4:
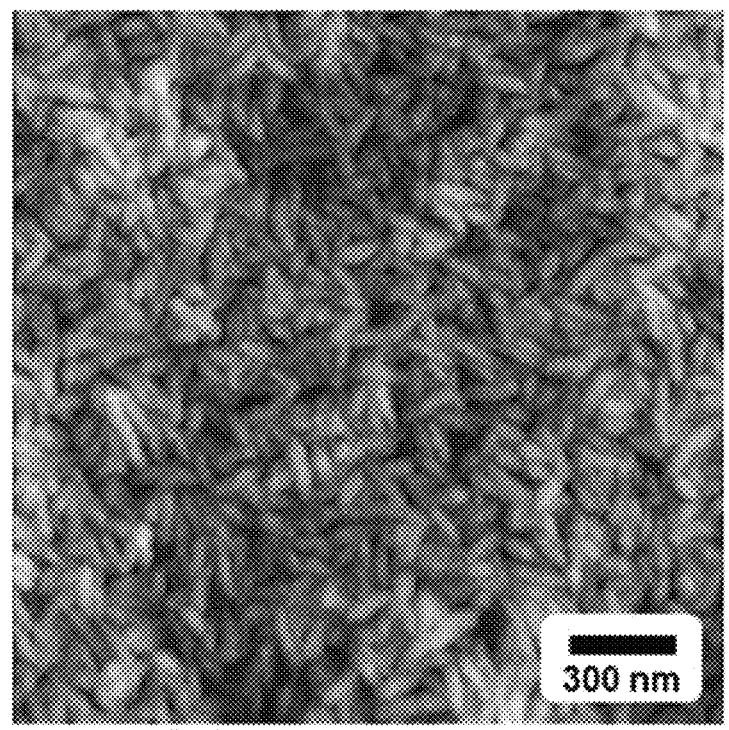
FIG. 4 is a reference diagram showing a state in which polarization is generated in the ferrodielectric layer by DC power.

FIG. 4 is a reference diagram showing a state in which polarization is generated in the ferrodielectric layer 130 by DC power. For example, in the ferrodielectric layer 130 having a 2×2 mm$^2$ luminescent region, the polarization is generated based on nucleation and growth of a ferrodielectric region accompanied with three treatments including inter-bonding process, intermolecular expansion of a chain rotation, and corresponding to inter-lamellar expansion of polarization reversal. As shown in FIG. 4, a result of a switching process shows that the ferrodielectric layer 130, which has an area of 200 nm×40 nm and includes 107 or more needle-like crystalline regions, is pseudo-continuous. Successive switching of the ferrodielectric layer 130 may result in intermediate polarization states due to a programming voltage.

The emission layer 140 may be disposed between the first electrode 110 and the ferrodielectric layer 130 and may emit light by the power applied between the first electrode 110 and the second electrode 120. When AC power is applied between the first electrode 110 and the second electrode 120, light is emitted as electrons and holes are combined by an electric field formed in the emission layer 140. The electric field formed in the emission layer 140 may be controlled by a residual polarization of the ferrodielectric layer 130, and thus emission characteristics of the emission layer 140 may be changed. Detailed description thereof will be given later.

The emission layer 140 may include at least one of zinc sulfide, calcium sulfide, calcium selenium sulfide, calcium sulfide yttrium, calcium sulfide strontium, strontium sulfide yttrium, calcium sulfide magnesium, zinc sulfide magnesium, strontium sulfide, calcium sulfide aluminum, calcium gallium sulfide, aluminum sulfide barium magnesium, aluminum sulfide barium, cyanoethyl cellulose, and polyvinylidene fluoride. Furthermore, the emission layer 140 may include one of the above-stated materials doped with at least one of magnesium, europium, samarium, chlorine, manganese, cerium, terbium, fluorine, gadolinium, thulium, copper, silver, and lead. Furthermore, the emission layer 140 may include at least one type of matrix material and at least one activator for activating the matrix. The matrix material may be selected from compounds of elements of Group 12 and Group 16 such as ZnS, ZnSe, ZnTe, CdS, and CdSe, compounds of elements of Group 2 and Group 16, such as CaS, SrS, CaSe, and SrSe, mixture or segregation of crystals of the above-stated compounds, such as ZnMgS, CaSSe, and CaSrS, thiogalate compounds, such as $CaGa_2S_4$, $SrGa_2S_4$ and $BaGa_2S_4$, thioaluminate compounds, such as $CaAl_2S_4$, $SrAl_2S_4$ and $BaAl_2S_4$, metal oxides, such as $Ga_2O_3$, $Y_2O_3$, CaO, $GeO_2$, $SnO_2$, and ZnO, and composite oxides, such as $Zn_2SiO_4$, $Zn_2GeO_4$, $ZnGa_2O_4$, $CaGa_2O_4$, $CaGeO_3$, $MgGeO_3$, $Y_4GeO_8$, $Y_2GeO_5$, $Y_2GeO_7$, $Y_2SiO_5$, $BeGa_2O_4$, $Sr_3Ga_2O_6$, $(Zn_2SiO_4\text{-}Zn_2GeO_4)$, $(Ga_2O_3\text{-}Al_2O_3)$, (CaO—$Ga_2O_3$), and $(Y_2O_3\text{—}GeO_2)$. The activator may be selected from a group of metal elements, such as Mn, Cu, Ag, Sn, Pb, Pr, Nd, Sm, Eu, Tb, Dy, Ho, Er, Tm, Yb, Ce, Ti, Cr, and Al. The activator may also be selected from a group of nonmetal elements, such as chlorine (Cl), iodine (I), and a group of fluoride materials, such as $TbF_2$ and $PrF_2$. The activator may also be a mixture of at least two types of activators.

The emission layer 140 may be deposited by a sputtering method, an EB deposition method, a resistance heating deposition method, a CVD method, etc. The emission layer 140 may be deposited by heating a substrate in a gas atmosphere, such as air, $N_2$, He, and Ar, or a mixed gas atmosphere. Therefore, the crystallinity of the emission layer 140 may be improved, and thus the brightness of a light-emitting device may be increased.

Figure 5A:
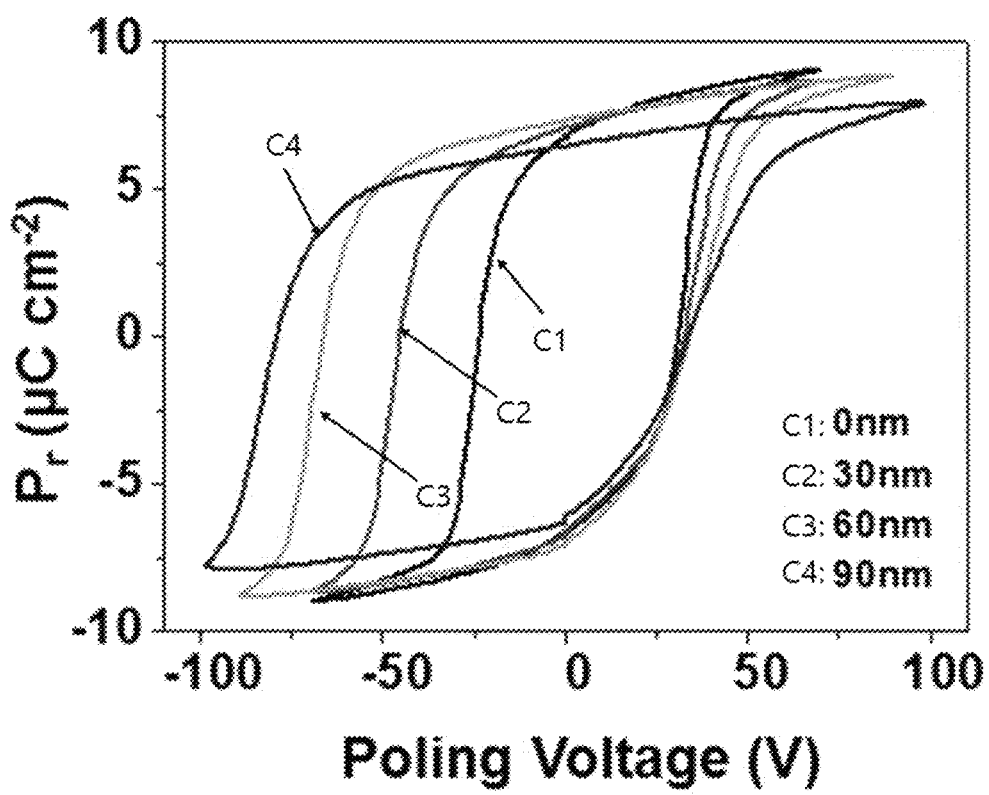
FIG. 5A are graphs showing polarization characteristics according to thickness of an emission layer.
Figure 5B:
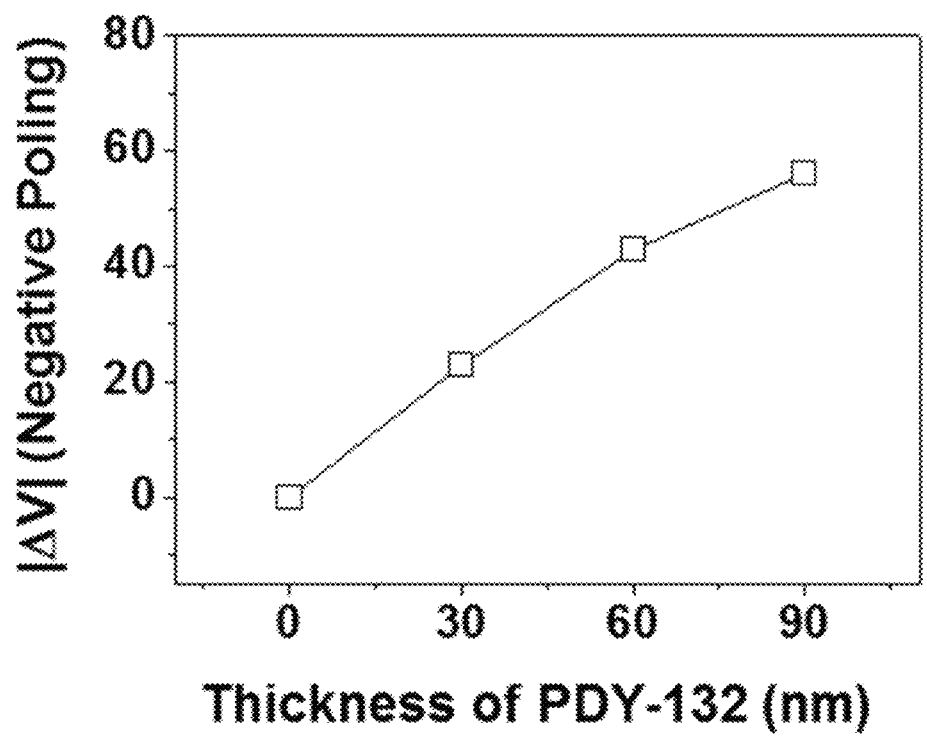
FIG. 5B is a graph showing the change of a negative coercive voltage according to thicknesses of the emission layer.

The thickness of the emission layer 140 may be relatively small as compared to the thickness of the ferrodielectric layer 130. However, when the thickness of the emission layer 140 is too small, the light-emitting efficiency may be deteriorated. When the thickness is too large, the driving voltage may be rises. Therefore, the thickness of the emission layer 140 may be within the range from 1 nm to 100 nm and may preferably be within the range from 10 nm to 50 nm. FIGS. 5A and 5B are a graph showing polarization characteristics according to the thickness of an emission layer. FIG. 5A is a graph showing the change of a hysteresis loop according to thicknesses of an emission layer, and FIG. 5B is a graph showing the change of a negative coercive voltage according to thicknesses of the emission layer. Referring to FIGS. 5A and 5B, the negative voltage range of the coercive voltage of a capacitor constituting the emission layer 140 is shifted according to the thickness of the emission layer 140. In other words, as the thickness of the emission layer 140 increases, the negative coercive voltage increases. Therefore, in order to minimize a programming voltage for the luminous member 100b, a range from 10 nm to 50 nm may be appropriate, and more particularly, the emission layer 140 may have the thickness of 30 nm.

Referring back to FIG. 1B, a carrier injecting layer 150 may be disposed between the ferrodielectric layer 130 and the emission layer 140 to inject field induced carriers into the emission layer 140. In other words, the carrier injecting layer 150 serves to supply field induced carriers supplied from the second electrode 120 to the emission layer 140. Here, the field induced carriers may include holes or electrons.

The carrier injecting layer 150 may include a material having a large work function to effectively transfer holes to the emission layer 140 and may include a material having a small work function to effectively transfer electrons to the emission layer 140. According to an embodiment, the carrier injecting layer 150 may include any material selected from among PEDOT:PSS, copper phthalocyanine (CuPc), amorphous carbon, and aromatic amine group materials. Furthermore, the carrier injecting layer 150 may include at least one first layer formed of an organic material and at least one second layer formed of an inorganic material, where the first layer and the second layer may be alternately stacked.

When the carrier injecting layer 150 is inserted, the hysteresis loop may have an asymmetry with a coercive voltage of about −40 V or greater than that of the positive polarity. Additional fields required for ferrodielectric polarization switching by a negative scan voltage may be generated due to consumption of holes in the p-type semiconducting emission layer 140. Since two capacitors of the emission layer 140 and the ferrodielectric layer 130 are connected in series, a greater voltage for a ferrodielectric switching may be required as compared to a case without the emission layer 140.

Figure 6:
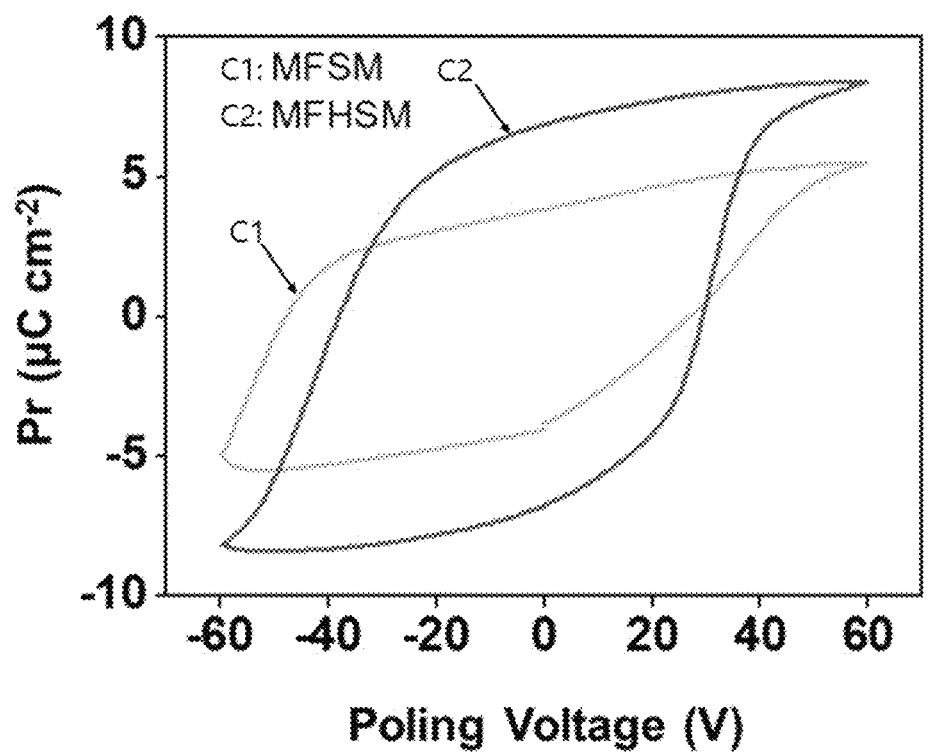
FIG. 6 is a hysteresis loop graph for a ferrodielectric layer according to presence and absence of a carrier injecting layer.

FIG. 6 is a hysteresis loop graph for a ferrodielectric layer according to presence and absence of the carrier injecting layer 150. Referring to FIG. 6, the ferrodielectric layer 130 (MFSM) without the carrier injecting layer 150 exhibits an asymmetric hysteresis loop having a lower residual polarization than the ferrodielectric layer 130 (MFHSM) with the carrier injecting layer 150. The residual polarization that is reduced due to the absence of the carrier injecting layer 150 is based on a depolarization field generated in the ferrodielectric layer 130 due to an injection of holes into the emission layer 140 directly contacting the ferrodielectric layer 130. The interface between the ferrodielectric layer 130 and the emission layer 140 may be effectively separated by the carrier injecting layer 150, and thus depolarization may be sufficiently reduced.

Figure 7A:
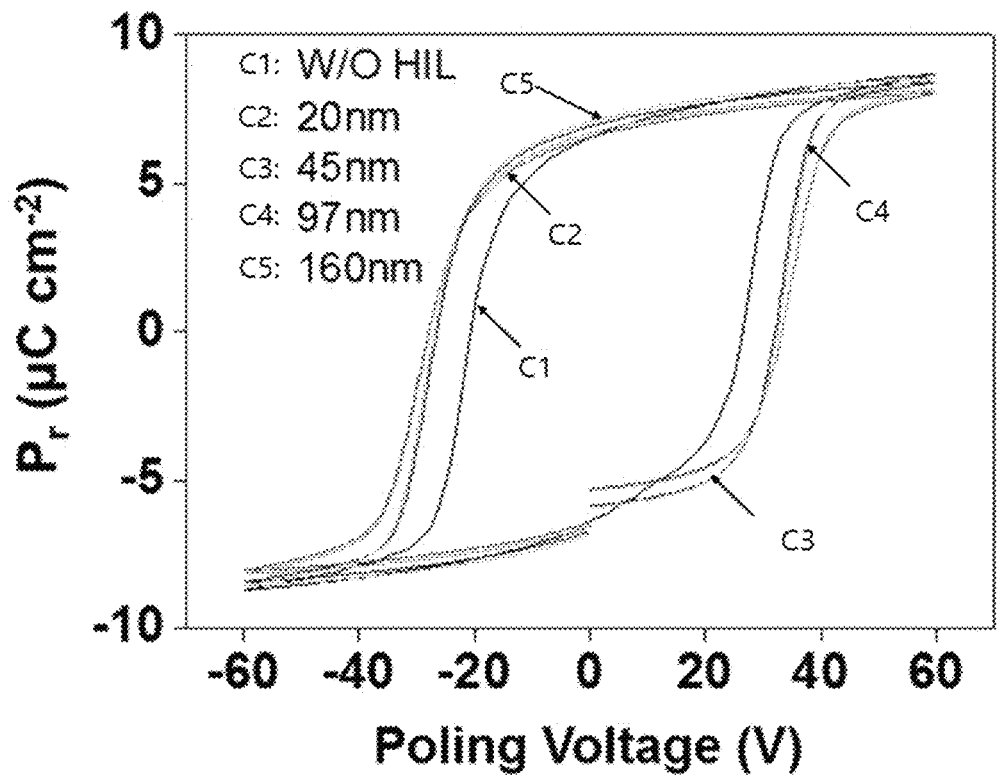
FIGS. 7A and 7B are graphs showing polarization characteristics according to the thickness of a carrier injecting layer.
Figure 7B:
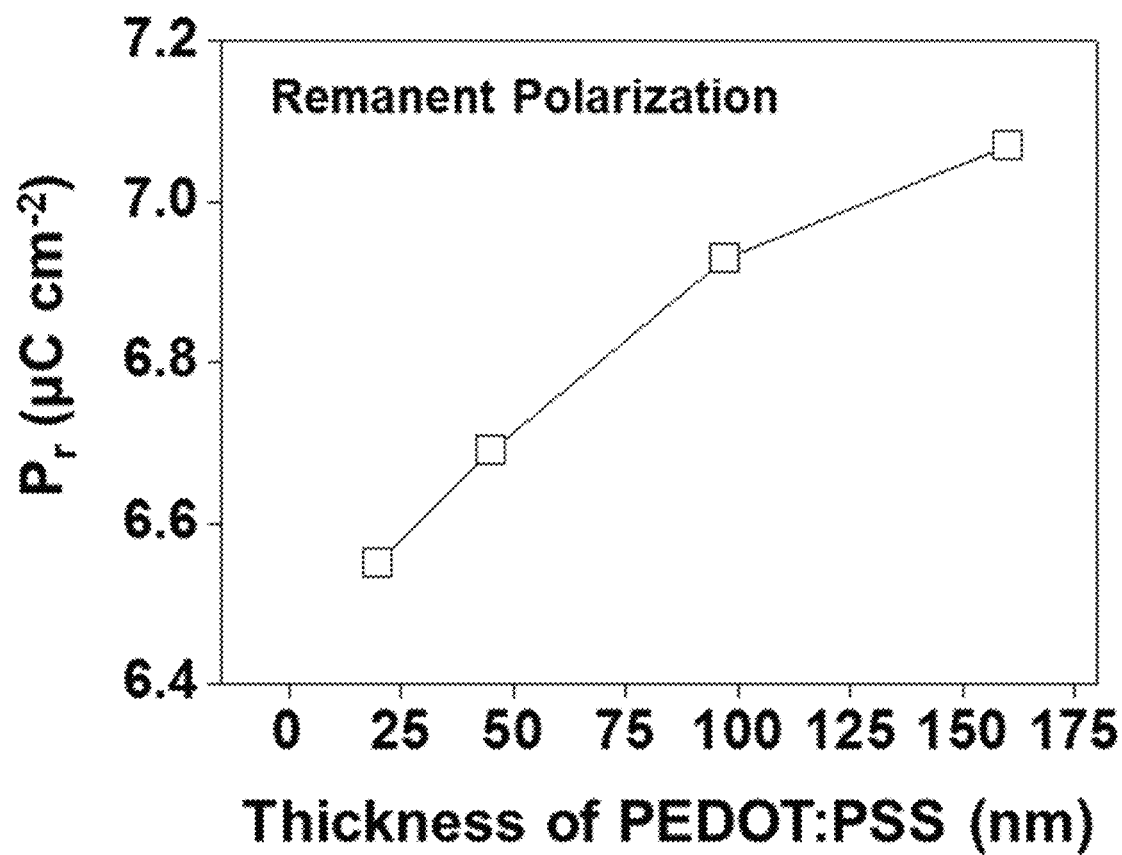

FIGS. 7A and 7B are graphs showing polarization characteristics according to the thickness of the carrier injecting layer 150. FIG. 7A is a graph showing a change of a hysteresis loop according to the thickness of the carrier injecting layer 150, and FIG. 7B is a graph showing a change of residual polarization according to the thickness of the carrier injecting layer 150.

Referring to FIGS. 7A and 7B, as the thickness of the carrier injecting layer 150 increases, residual polarization increases. The thickness of the carrier injecting layer 150 may be equal to or greater than 1 nm and smaller than or equal to 300 nm and may preferably be equal to or greater than 10 nm or more and smaller than or equal to 100 nm, in consideration of the polarization characteristics.

Referring back to FIG. 1C, a spacer 160 may be inserted between the first electrode 110 and the emission layer 140. The spacer 160 may form a nano-air gap between the first electrode 110 and the emission layer 140. The spacer 160 is a member for maintaining a gap between the first electrode 110 and the emission layer 140 and may be formed of an insulating material for insulation between the first electrode 110 and the emission layer 140. The nano-air gap formed by the spacer 160 may form an air-insulating layer, thereby prevent the emission layer 140 from directly contacting the first electrode 110. Furthermore, the nano-air gap may also be utilized a path for movement of a target material for sensing. Here, the thickness of the nano air gap may be changed according to sensitivity setting of a sensor, such as pressure sensing or operation sensing.

The luminous members 100A, 100B, and 100C shown in FIGS. 1A, 1B, and 1C may be fixed on a substrate supporting the luminous members 100A, 100B, and 100C. The substrate may be formed of a material exhibiting excellent electrical insulation and heat resistance and may be formed of a material exhibiting high transparency to transmit light from a luminous member therethrough. As unlimited examples, the substrate may be a transparent resin substrate including glass, sapphire, transparent ceramic, or polyimide. In another embodiment, the substrate may be an opaque substrate, such as a silicon wafer.

Hereinafter, specific functions and operations of the luminous member will be described.

When an AC power is applied to the luminous member in a state where residual polarization is generated in the ferrodielectric layer 130 of the luminous member, an electric field formed in the emission layer 140 of the luminous member is controlled according to polarity or size of the residual polarization of the ferrodielectric layer 130, and thus emission characteristics of the emission layer 140 may be changed. In other words, when DC power is applied between the first electrode 110 and the second electrode 120 of the luminous member, the ferrodielectric layer 130 may be polarized by an electric field generated by the DC power. The generated polarization remains as residual polarization according to an electric field direction and magnitude of the applied DC power even when the application of the DC power is stopped. The residual polarization remaining according to the electric field direction and the magnitude of the DC power has non-volatile built-in potential according to polarity (e.g., positive polarity (+) or negative polarity (−)) and magnitude of the polarization. Next, when AC power is applied between the first electrode 110 and the second electrode 120 of the luminous member in which the residual polarization is generated, field induced carriers may be injected from the carrier injecting layer 150 into the emission layer 140 due to the polarity and the magnitude of the residual polarization generated in the ferrodielectric layer 130 and an electric field based on the AC power. As the number of field induced carriers injected from the carrier injecting layer 150 into the emission layer 140 is controlled, emission characteristics of the emission layer 140 including brightness of light, intensity of light, and contract, may be controlled.

Figure 8A:
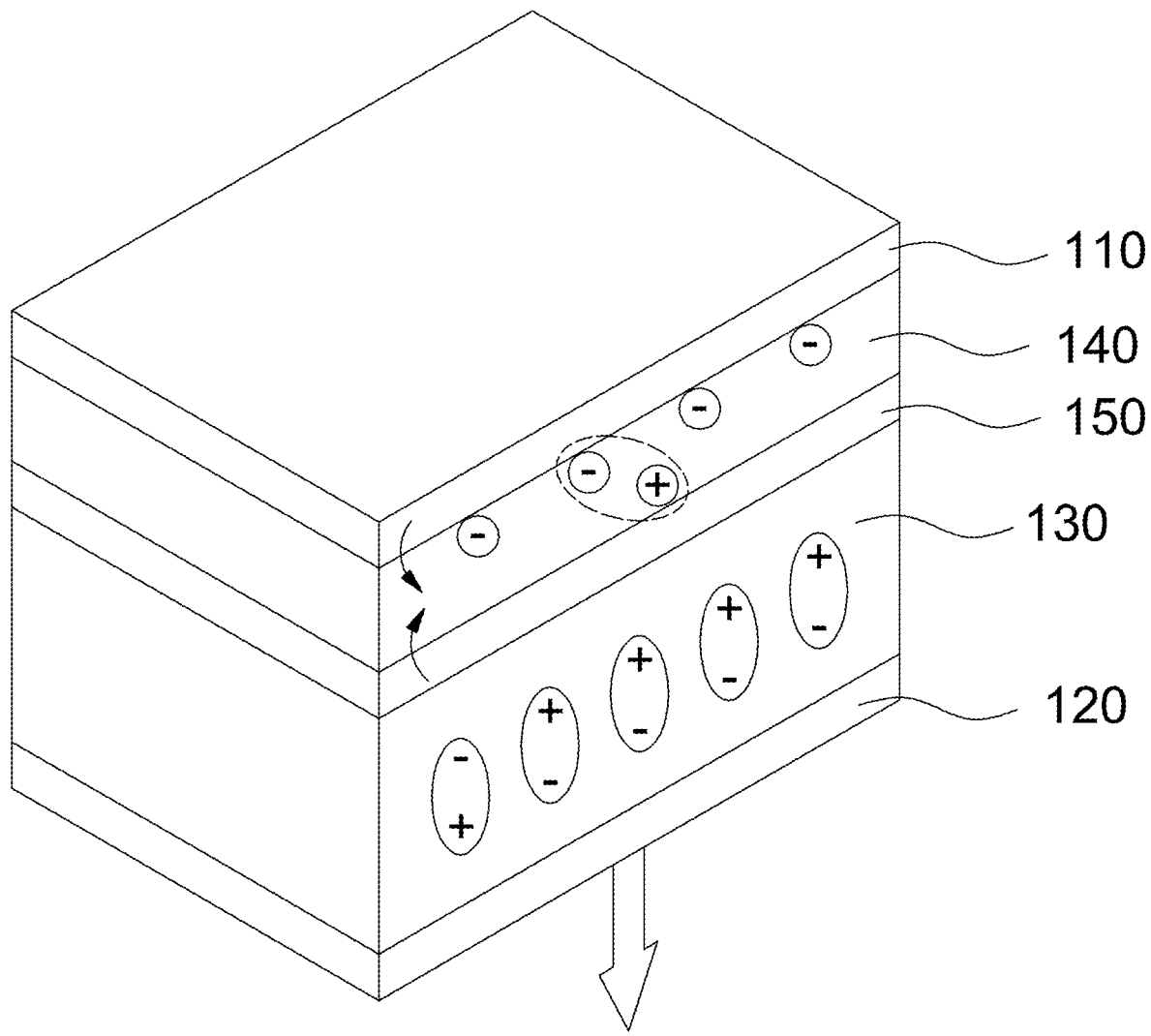
FIG. 8A and FIG. 8B are reference diagrams showing emission characteristics according to application of AC power to a luminous member in which residual polarization is generated by DC power.
Figure 8B:
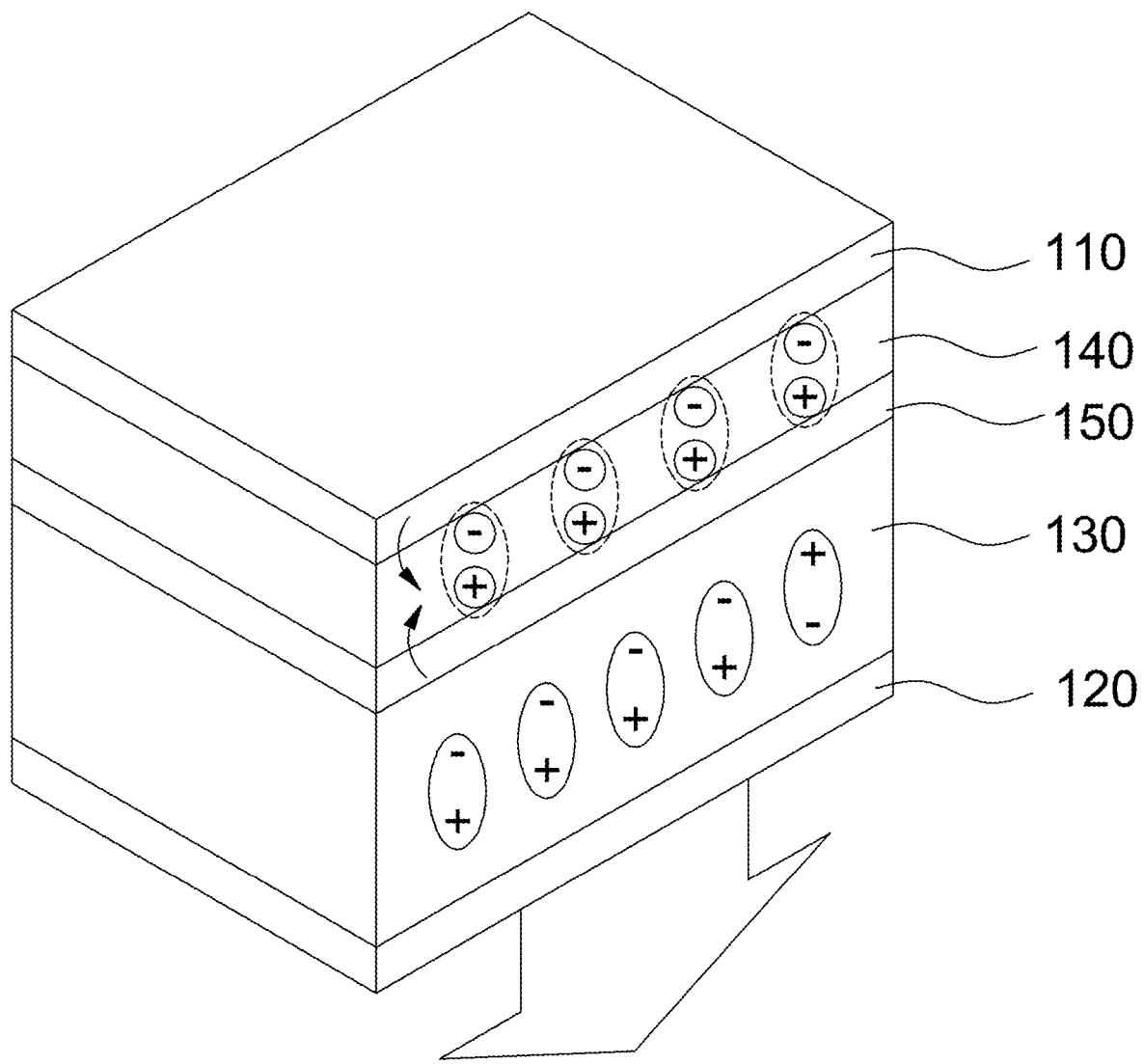

FIG. 8A and FIG. 8B are reference diagrams showing emission characteristics according to application of AC power to a luminous member in which residual polarization is generated by DC power. FIG. 8A shows residual polarization generated in the ferrodielectric layer 130 when a negative polarity of a DC power is connected to the first electrode 110 and a positive polarity of the DC electric power is connected to a second electrode 120 to apply the DC power (e.g., −60 V) to the ferrodielectric layer 130. Furthermore, FIG. 8B shows residual polarization generated in the ferrodielectric layer 130 when a negative polarity of a DC power is connected to the first electrode 110 and a positive polarity of the DC electric power is connected to a second electrode 120 to apply the DC power (e.g., +50 V) to the ferrodielectric layer 130. In the luminous member, ferrodielectric polarization due to the DC power forms a nonvolatile built-in potential.

Referring to FIG. 8A, electrons are transferred from the first electrode 110 to the emission layer 140 as AC power is applied to a luminous member in which residual polarization is generated in the ferrodielectric layer 130. At the same time, some of holes may move from the carrier injecting layer 150 to the emission layer 140. Therefore, electrons and holes are combined with each other in the emission layer 140 and light is emitted therefrom. Furthermore, referring to FIG. 8B, electrons move from the first electrode 110 to the emission layer 140 as AC power is applied to the luminous member 100B in which residual polarization is generated in the ferrodielectric layer 130. At the same time, a plurality of holes may move from the carrier injecting layer 150 to the emission layer 140. Therefore, electrons and holes are combined with each other in the emission layer 140 and light is emitted therefrom. At this time, brightness of the light emission shown in FIG. 8B may be higher than brightness of the light emission shown in FIG. 8A. The reason thereof is that, since the number of holes injected from the carrier injecting layer 150 into the emission layer 140 in FIG. 8B is relatively large as compared to the number of holes in FIG. 8A due to polarity and magnitude of the residual polarization formed in the ferrodielectric layer 130 shown in FIG. 8B, the number of electrons and holes combined in the emission layer 140 increases.

According to an embodiment, emission characteristics of a luminous member based on application of AC power are related to the frequency of the applied AC power. The frequency of the AC power should be fast enough to not to hinder a programmed ferrodielectric residual polarization.

Figure 9:
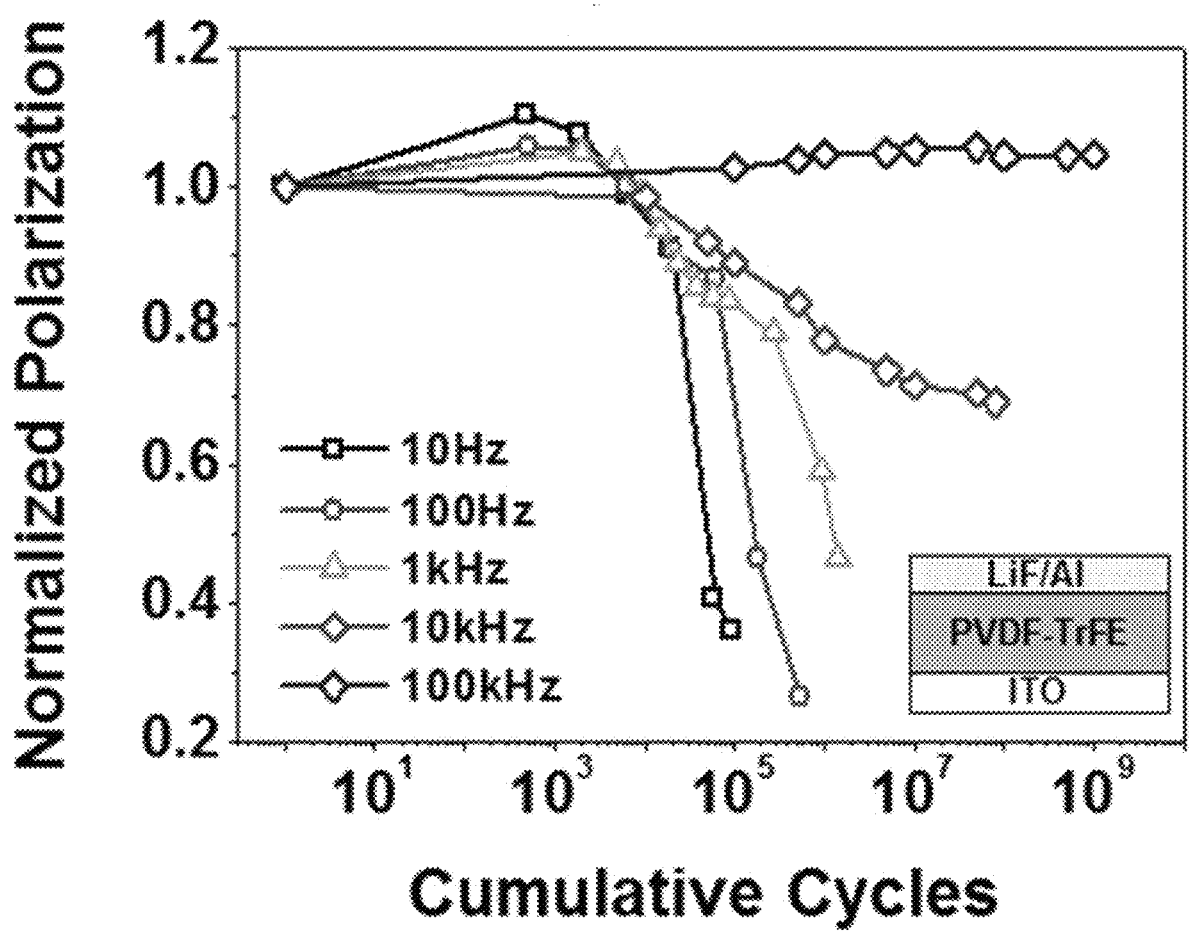
FIG. 9 is a graph showing the residual polarization characteristics related to frequencies of AC power.

FIG. 9 is a graph showing the residual polarization characteristics related to frequencies of AC power. Referring to FIG. 9, the frequency dependent polarization fatigue properties of the ferrodielectric layer 130 may provide a clue to determine an appropriate frequency. By repeatedly applying AC power associated with chain rotation along an electric field, the residual polarization of the ferrodielectric layer 130 rapidly declines when a voltage scanning of a certain number of times or more is made. Therefore, an appropriate frequency range is demanded for emission of a luminous member based on application of AC power. As shown in FIG. 9, the number of times of fatigue switching at which the residual polarization begins to decline depends on a frequency, and the number of times of the fatigue switching increases as the frequency increases. When the switching frequency is faster than an inherent speed of ferrodielectric switching, the residual polarization is not deteriorated.

Figure 10:
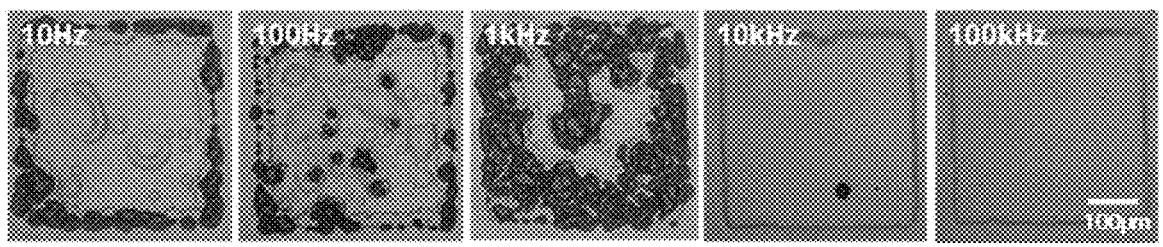
FIG. 10 is a reference diagram for comparing fatigue properties of a luminous member according to a change of frequency.

FIG. 10 is a reference diagram for comparing fatigue properties of a luminous member according to a change of frequency. As shown in FIG. 10, the frequency-independent fatigue properties of a luminous member may be observed at frequencies from about 60 kHz. Therefore, based on the frequency-dependent fatigue properties, a luminous member may be designed to be driven by applying AC power having a frequency of about 60 kHz or higher. However, as the frequency gradually increases, the brightness of light emission may decrease, and thus the magnitude of the frequency should be appropriately selected. The frequency range related to the brightness will be described later.

According to an embodiment, in a luminous member, residual polarizations may be generated by two different DC powers of +50V and 60V, respectively. In other words, DC powers of +50V and 60V are applied to the luminous member, and thus residual polarizations thereof are formed in the ferrodielectric layer 130, respectively. Next, AC power is applied to the luminous member having the residual polarizations to confirm the emission characteristics.

Figure 11:
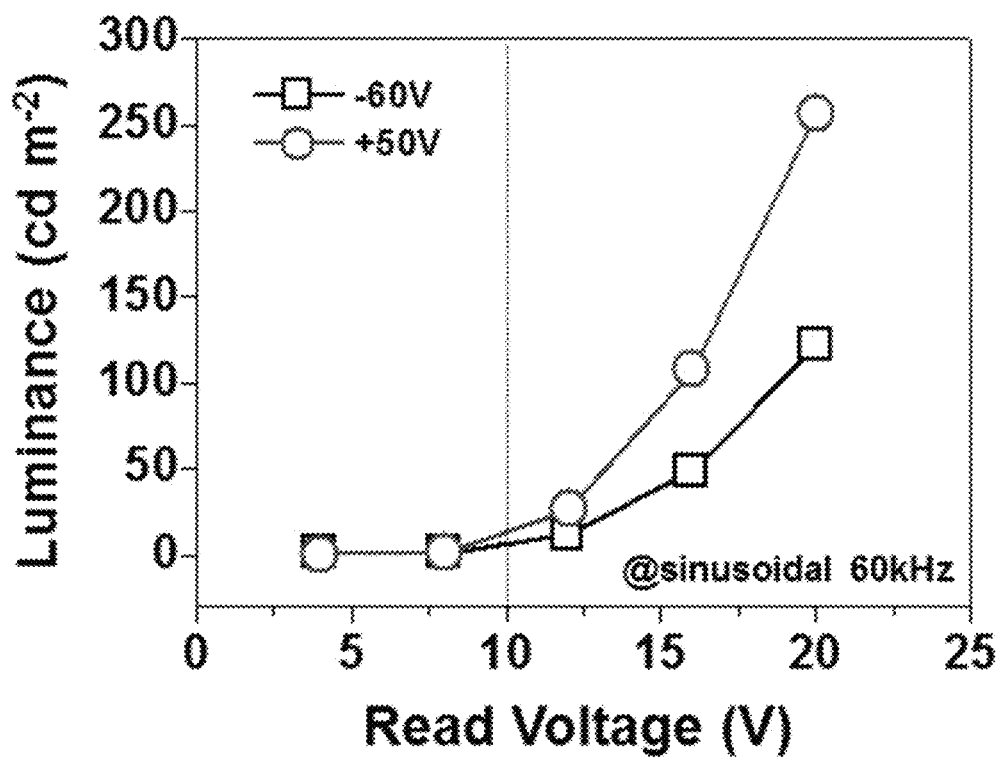
FIG. 11 is a graph comparing the emission characteristics based on application of AC power to a luminous member in which two types of residual polarizations are generated.
Figure 12:
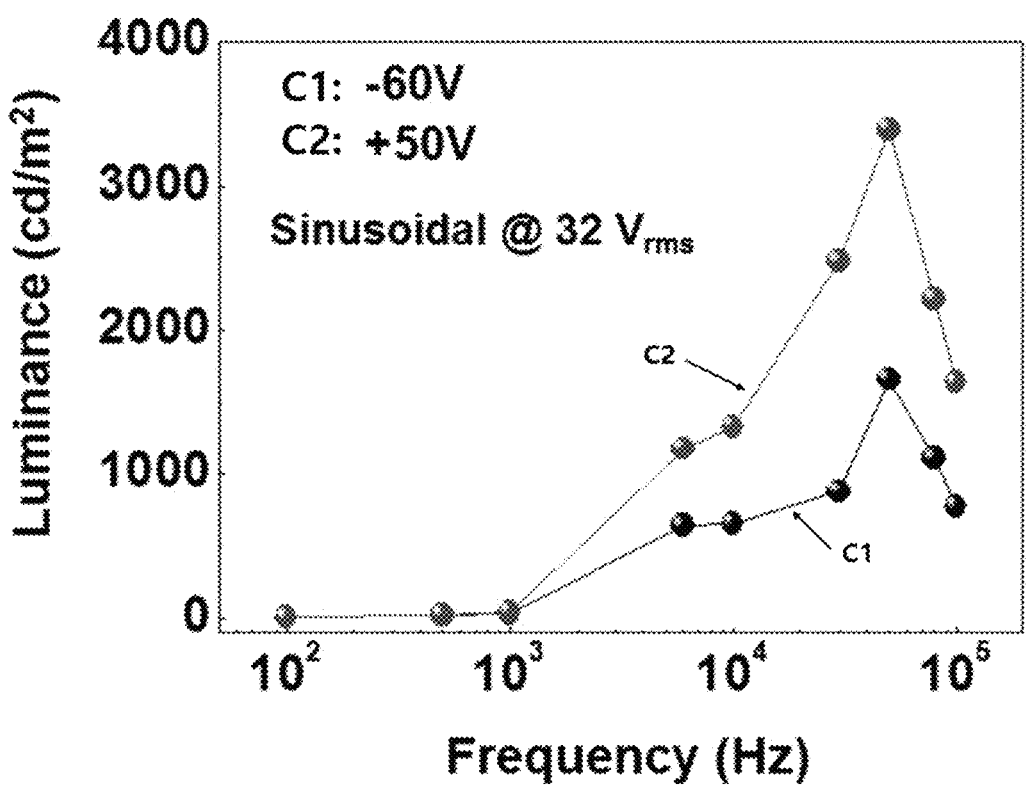
FIG. 12 is a graph for comparing the emission characteristics based on changes of frequency of AC power applied to a luminous member in which two types of residual polarizations are generated.

FIG. 11 is a graph comparing the emission characteristics based on application of AC power to a luminous member in which two types of residual polarizations are generated, and FIG. 12 is a graph for comparing the emission characteristics based on changes of frequency of AC power applied to a luminous member in which two types of residual polarizations are generated.

Referring to FIG. 11, based on continuous application of AC power, the luminous member exhibits higher brightness in a case where the residual polarization is generated at +50V as compared to a case where the residual polarization is generated at −60V. Furthermore, referring to FIG. 12, it may be observed that, as the frequency increases, the brightness of the luminous member increases. However, the maximum brightness is obtained at the frequency of 60 kHz, and the brightness decreases at frequencies increasing thereafter. Therefore, in consideration of the fatigue properties and emission characteristics of the luminous member, the frequency of the AC power may be appropriately set to 60 kHz.

Figure 13:
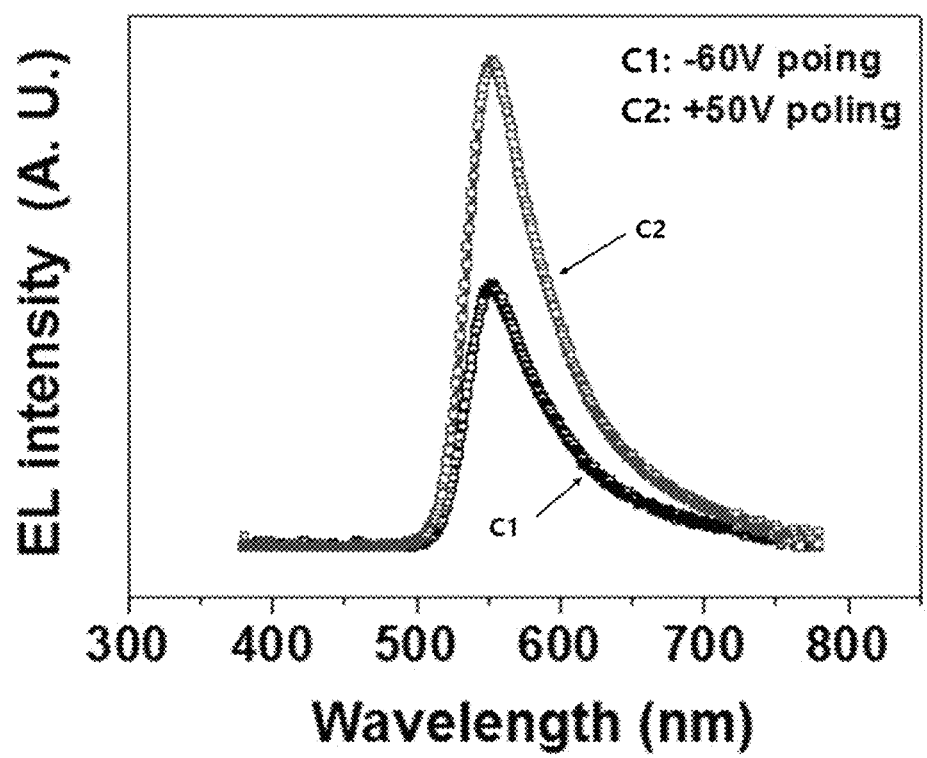
FIG. 13 is a graph showing brightness according to wavelengths of light emitted from an emission layer.

According to an embodiment, FIG. 13 is a graph showing brightness according to wavelengths of light emitted from an emission layer. As shown in FIG. 13, the emission layer 140 exhibits the maximum brightness at the wavelength of 550 nm.

According to an embodiment, when there is no difference in injection barrier from the first electrode 110 of a luminous member to the emission layer 140, the built-in potential in the ferrodielectric layer 130 affects injection of field induced carriers from the carrier injecting layer 150 to the emission layer 140. Therefore, the thickness of the emission layer 140 of the luminous member having the residual polarization affects the number of excitons that represent the emission intensity.

Figure 14:
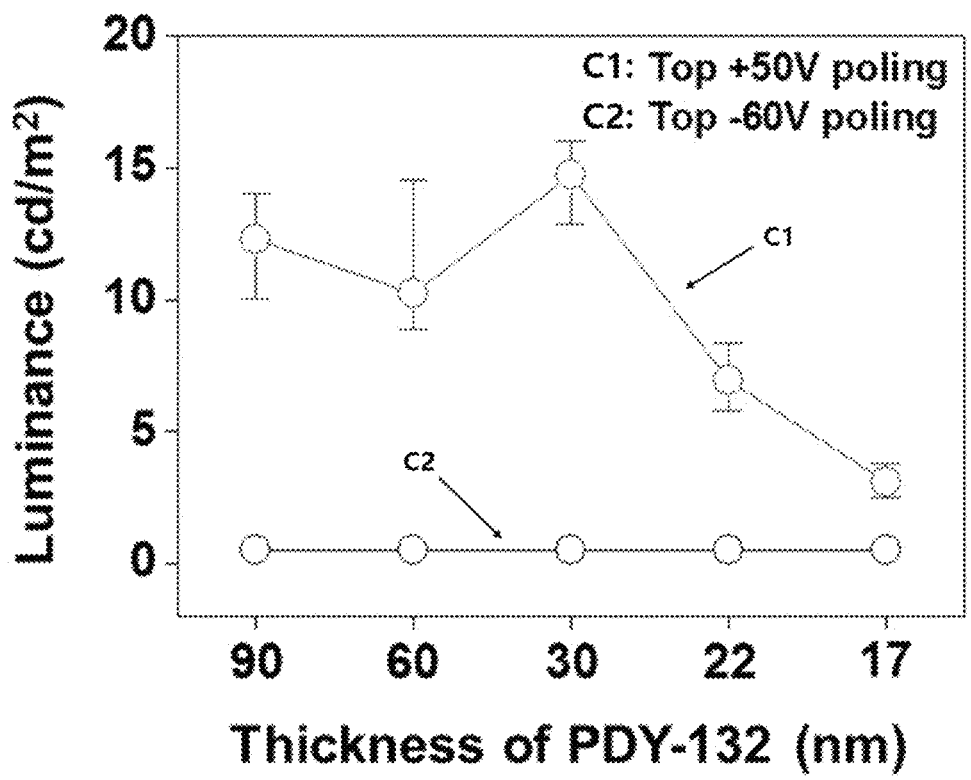
FIG. 14 is a graph showing brightness of emission according to thicknesses of an emission layer.

FIG. 14 is a graph showing brightness of emission according to thicknesses of an emission layer. FIG. 14 shows brightness of emission according to thicknesses of emission layers for respective luminous member in which residual polarizations are formed by DC powers of +50V and −60V. Referring to FIG. 14, the brightness of emission of a luminous member having the residual polarization of +50 V exhibits the maximum brightness when the thickness of the emission layer 140 is 30 nm. Therefore, it is necessary to select an optimal thickness of the emission layer 130 to minimize DC power for generating a residual polarization.

Figure 15:
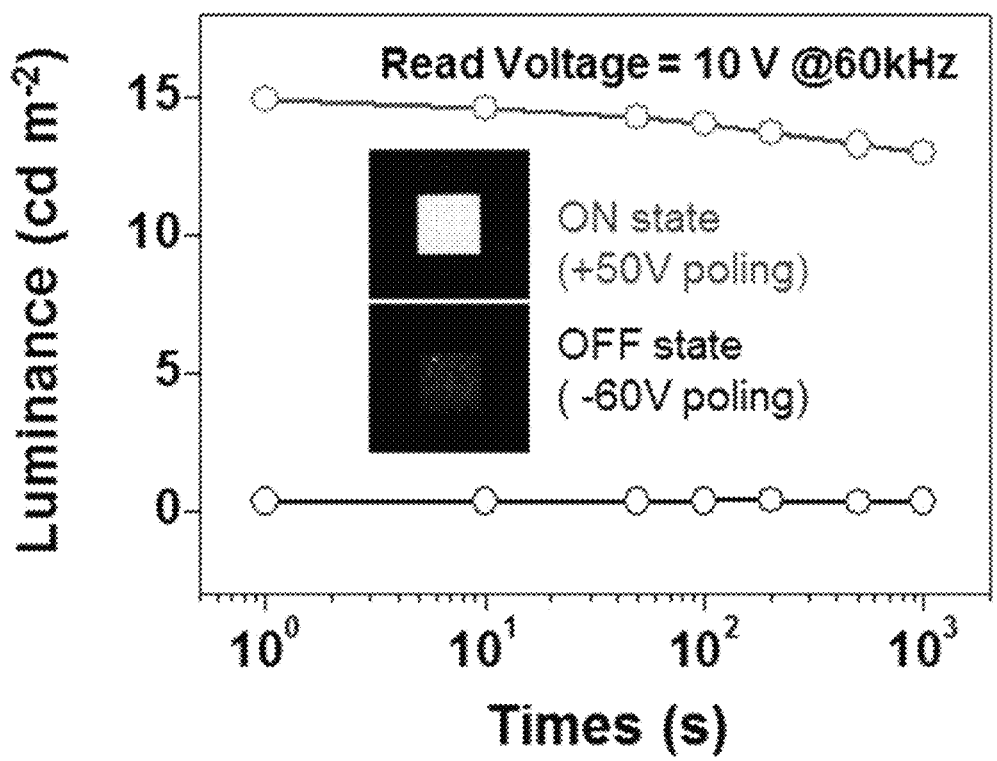
FIG. 15 is a graph for comparing light retention properties regarding luminous members in which two types of residual polarizations are generated.
Figure 16:
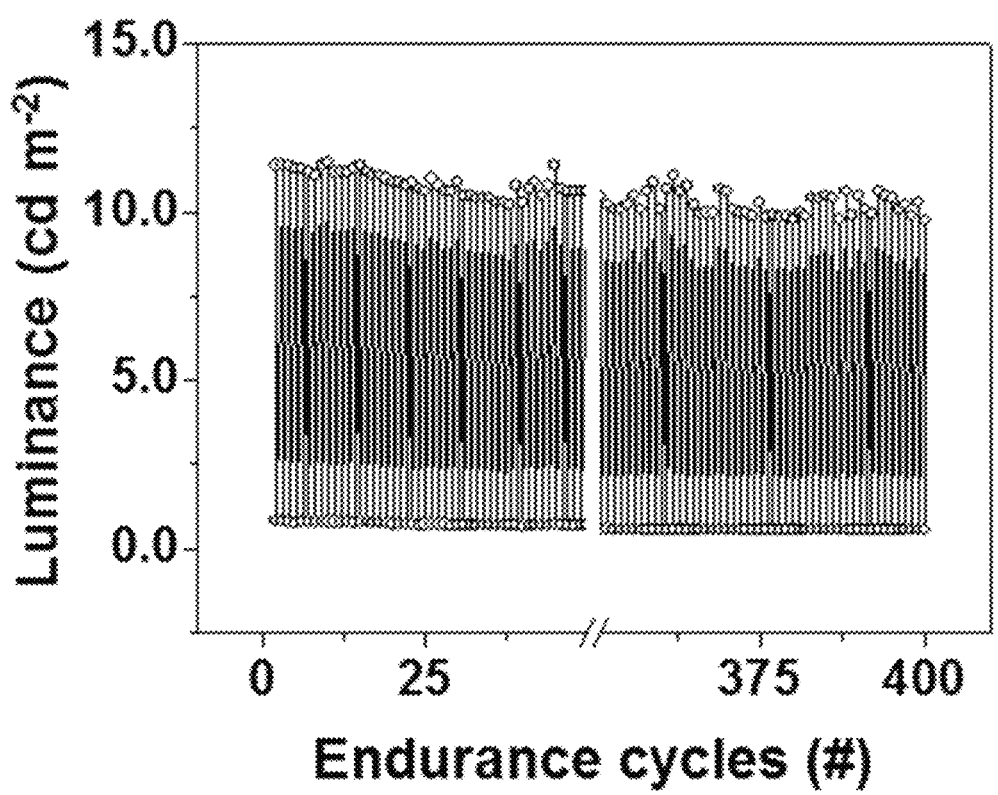
FIG. 16 is a graph for comparing durability cycles regarding the luminous members in which two types of residual polarizations are generated.
Figure 17:
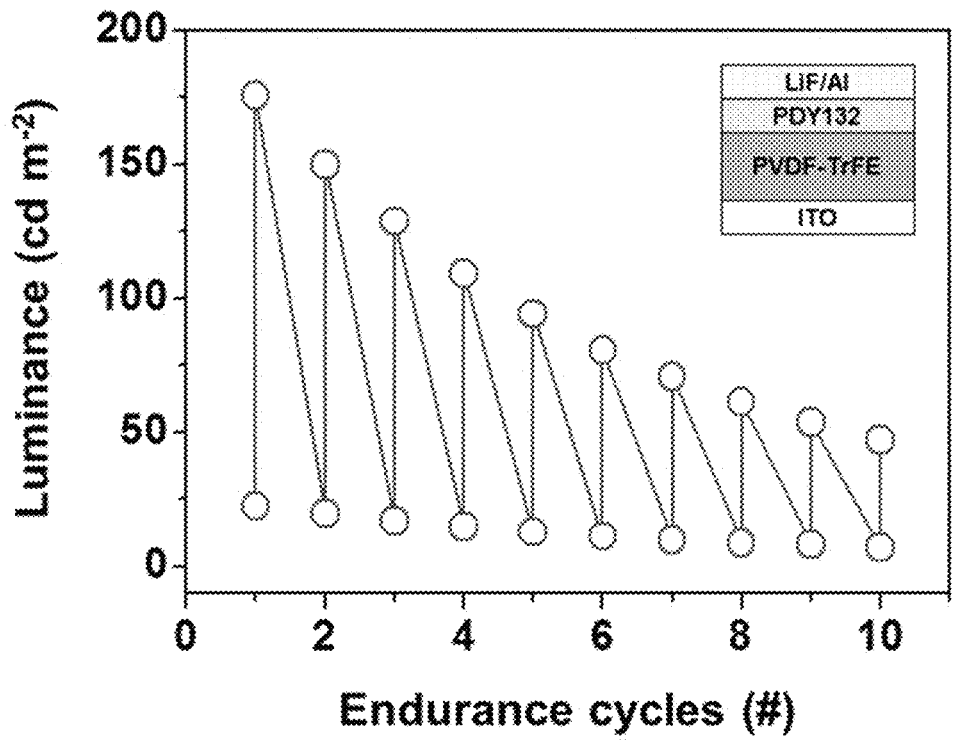
FIG. 17 is a graph for comparing changes of brightness associated with the durability cycles regarding the luminous members in which two types of residual polarizations are generated.

According to an embodiment, FIG. 15 is a graph for comparing light retention properties regarding luminous members in which two types of residual polarizations are generated, FIG. 16 is a graph for comparing durability cycles regarding the luminous members in which two types of residual polarizations are generated, and FIG. 17 is a graph for comparing changes of brightness associated with the durability cycles regarding the luminous members in which two types of residual polarizations are generated.

Referring to FIG. 15, when the light retention property regarding a luminous member having residual polarization is observed over time at a lead voltage of 10 V and a frequency of 60 kHz, the brightness 15 cd/m$^2$ of the luminous member in which the residual polarization is generated at +50V is maintained for at least 103 seconds. Furthermore, the brightness of 1 cd/m$^2$ of the luminous member in which the residual polarization is generated at −60 V is maintained for a long time. Furthermore, referring to FIG. 16, related to durability of write/read cycles of the luminous members, at least one 400 successful durability cycles may be obtained for the luminous members in which the residual polarizations are generated at +50V and −60V. Referring to FIG. 17, the carrier injecting layer 150 is useful for stable durability cycles. Without the carrier injecting layer 150, the brightness based on write/read cycles gradually declines due to a polarization field formed at the interface between the ferrodielectric layer 130 and the emission layer 140.

Figure 18:
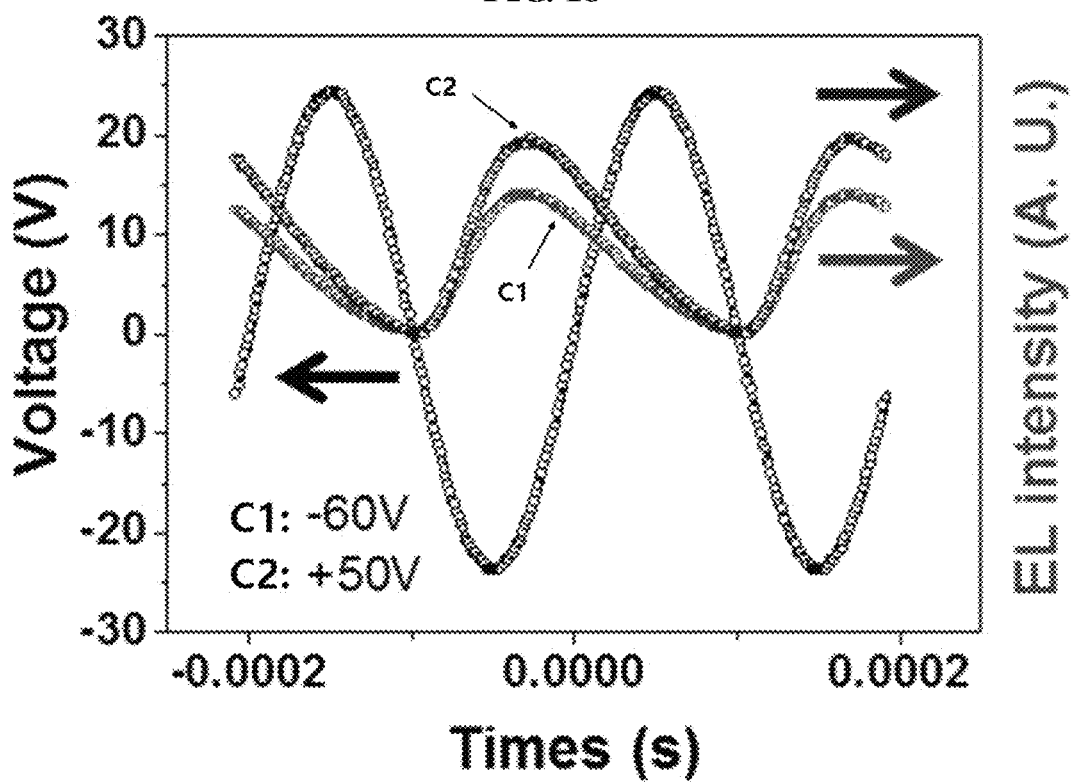
FIG. 18 is a graph showing intensity of emission based on application of AC power to respective luminous members in which two types of residual polarization are generated.
Figure 19:
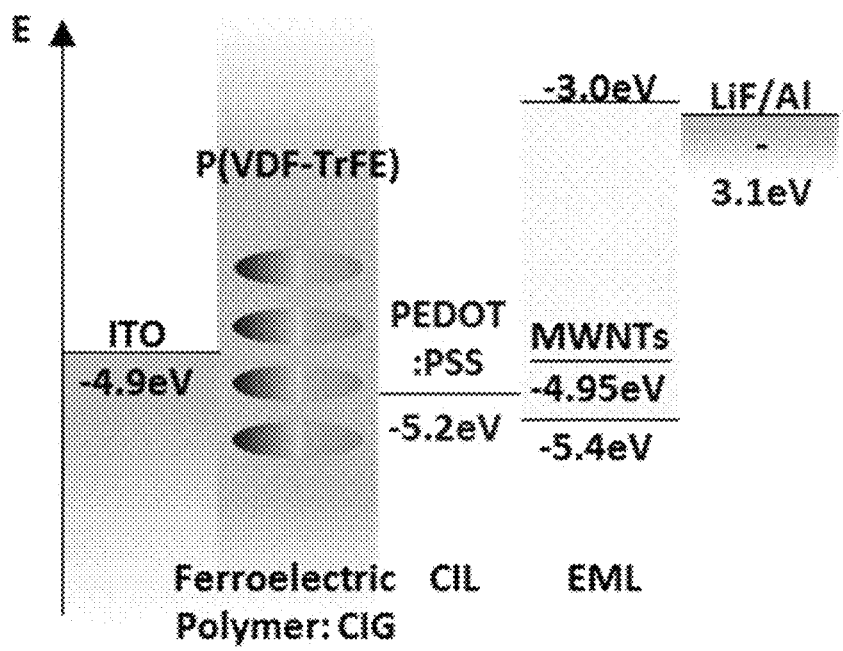
FIG. 19 is a graph showing the emission behaviors according to energy levels of respective components of a luminous member.

FIG. 18 is a graph showing intensity of emission based on application of AC power to respective luminous members in which two types of residual polarization are generated, and FIG. 19 is a graph showing the emission behaviors according to energy levels of respective components of a luminous member.

Referring to FIG. 18, an emission mechanism emits light corresponding to a response of a luminous member based on a sinusoidal AC voltage. Electrons injected from the first electrode 110 into the emission layer 140 and holes injected from the carrier injecting layer 150 into the emission layer 150 form excitons, and light is emitted as the excitons are recombined in the emission layer 140. The luminous member emits light regardless of whether a residual polarization is generated due to DC power. At this time, it may be observed that intensity of emission of the luminous member having the residual polarization generated by DC power of +50V is higher than that of the luminous member having the residual polarization generated by DC power of −60V. Referring to FIG. 19, when electrons are directly injected from the first electrode 110 having an injection barrier of 0.1 eV, rich electron carriers are injected from negative voltage signals to the emission layer 140. At the same time, holes are injected from the carrier injecting layer 150 into the emission layer 140. When the first electrode 110 has a positive voltage, light is hardly emitted therefrom because of a high injection barrier for holes and electrons. The built-in potential based on a residual polarization generated in the ferrodielectric layer 130 by DC power may effectively change a field between the second electrode 120 and the carrier injecting layer 150. The total number of excitons is determined based on field inducing holes rather than electrons in the luminous member. An electric field changed by the ferrodielectric layer 130 affects field inducing hole injection in AC power. As AC power is applied, the built-in potential of the ferrodielectric layer 130 in which the residual electrode is generated at +50V may interact with a negative voltage, such that an effective field applied to the emission layer 140 may be increased. As shown in FIG. 11, a large potential in the emission layer 140 based on a negative voltage increases the number of holes to be injected to the emission layer 140, and thus light of high brightness is emitted. Meanwhile, in the ferrodielectric layer 130 in which the residual polarization is generated at −60V, the built-in potential reduces an effective negative voltage applied to the ferrodielectric layer 130 and increases the effective positive voltage, and thus light of low brightness is emitted.

Figure 20:
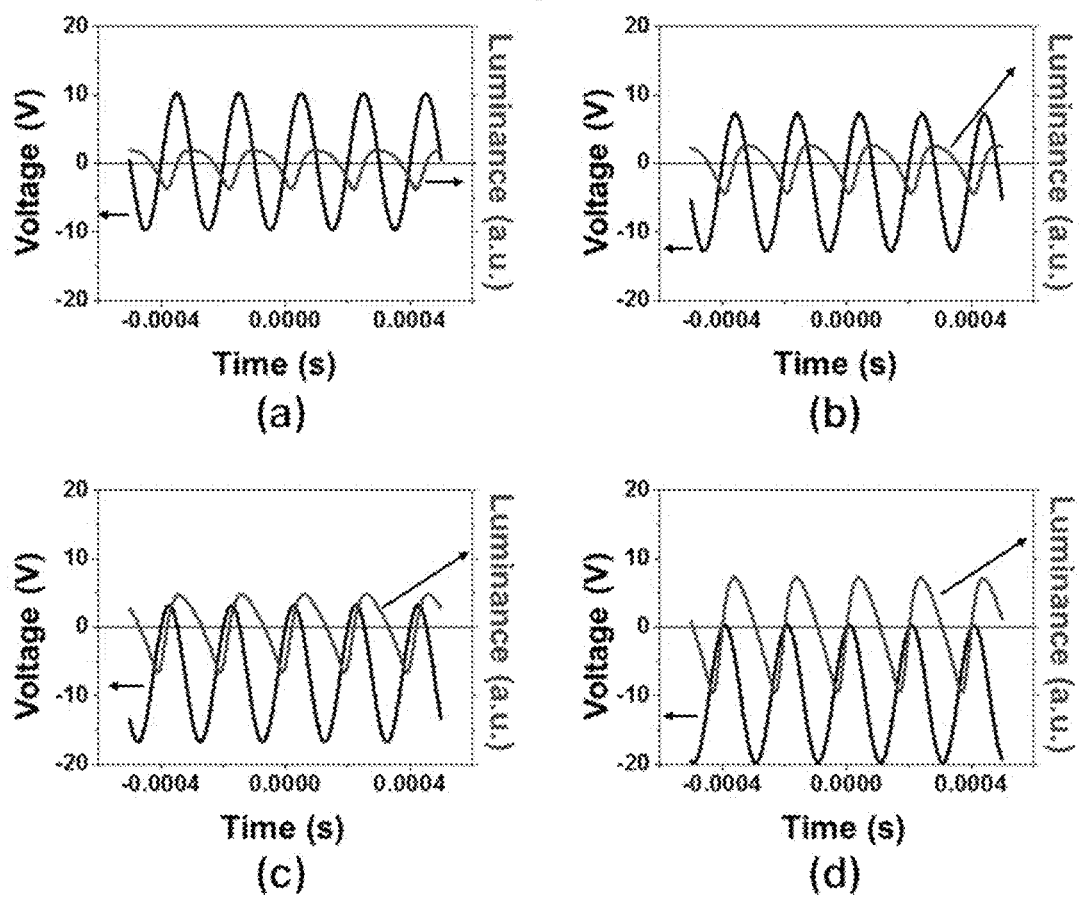
FIG. 20 is a graph showing a change of emission intensity according to a change in a negative voltage of AC power applied to a luminous member.
Figure 21:
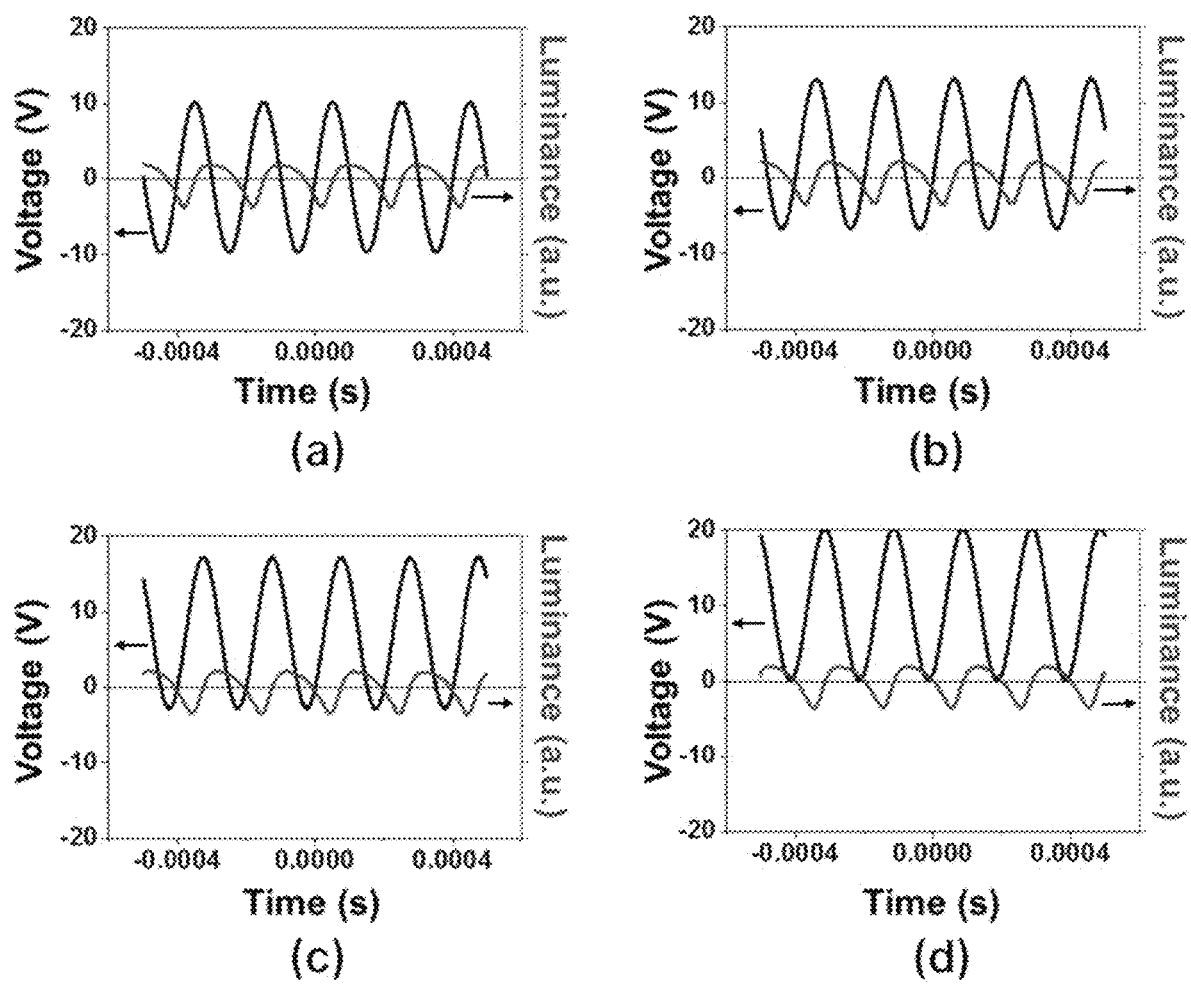
FIG. 21 is a graph showing a change of emission intensity according to a change in a positive voltage of the AC power applied to the luminous member.

FIG. 20 is a graph showing a change of emission intensity according to a change in a negative voltage of AC power applied to a luminous member, and FIG. 21 is a graph showing a change of emission intensity according to a change in a positive voltage of the AC power applied to the luminous member. Referring to FIGS. 20 and 21, it may be observed that the emission intensity of the luminous member increases as the negative AC power increases, and the emission intensity decreases as the positive AC power increases.

Figure 22:
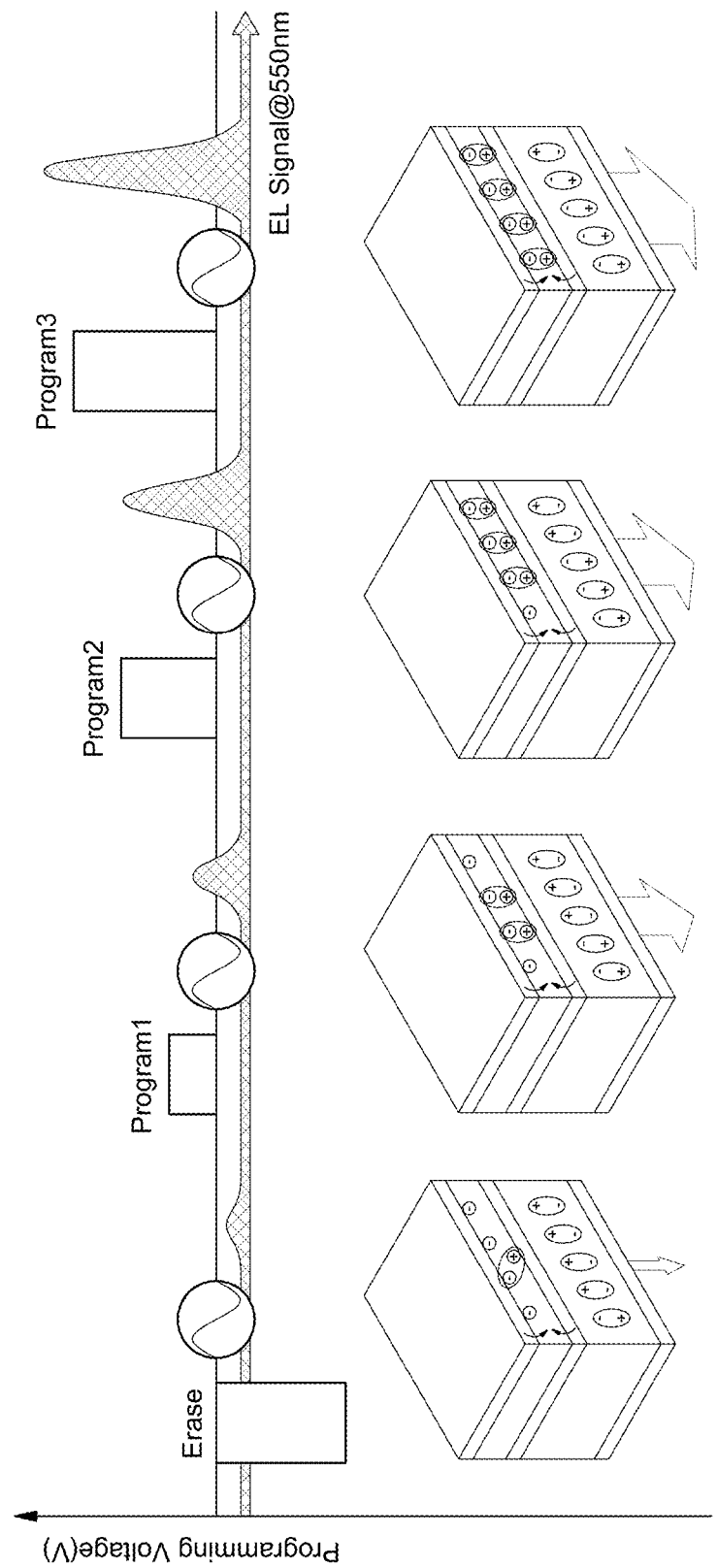
FIG. 22 is a reference diagram showing residual polarization states of luminous members programmed by various DC power.
Figure 23:
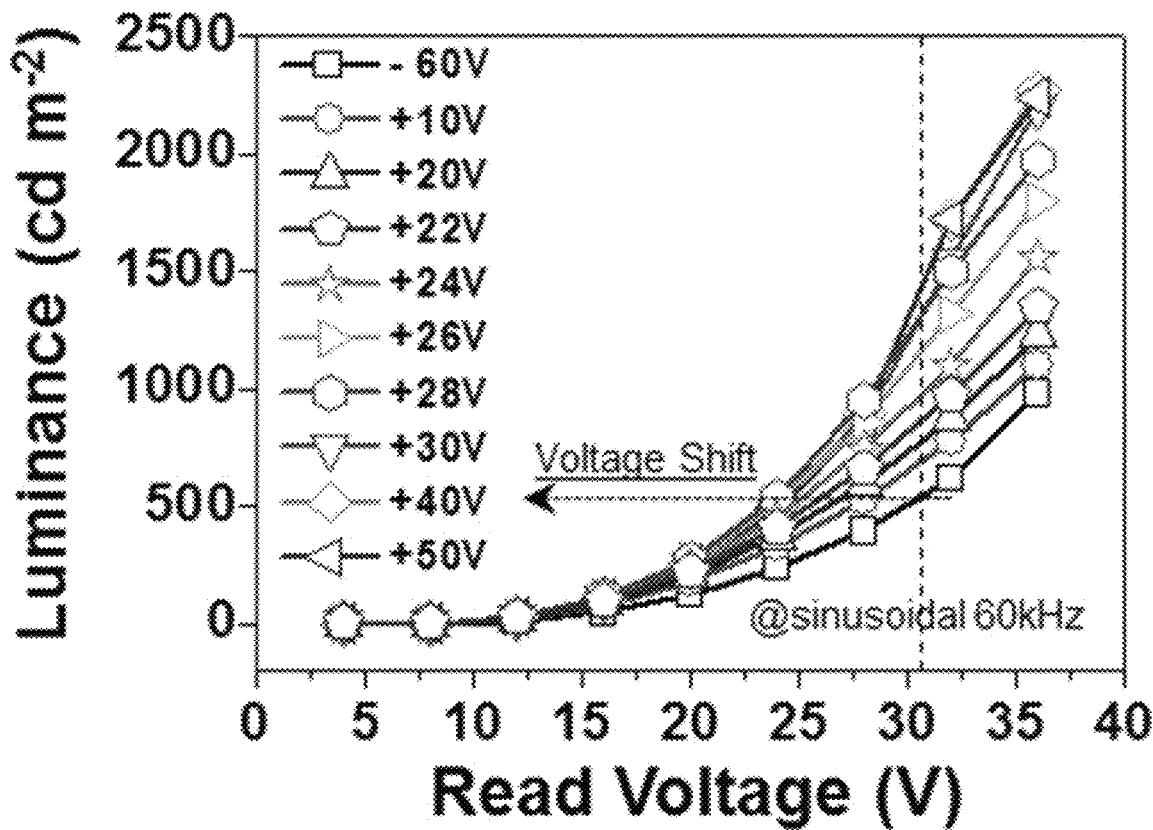
FIG. 23 is a graph showing emission characteristics regarding luminous members having various residual polarizations.

According to an embodiment, FIG. 22 is a reference diagram showing residual polarization states of luminous members programmed by various DC powers, and FIG. 23 is a graph showing emission characteristics regarding luminous members having various residual polarizations. As shown in FIGS. 22 and 23, by controlling amounts of residual polarizations by various negative DC powers or positive DC powers, emission characteristics regarding the luminous members may be effectively controlled. In other words, as shown in FIG. 23, the emission performance checked at the L-V characteristic may vary according to programmed DC powers. As the magnitude of the programmed DC power increases from negative to positive, the emission characteristics based on application of AC power, such as brightness and light intensity, increase. A luminous member with residual polarization generated by DC power from −60 V to +50 V exhibits brightness from 600 cd/m$^2$ to 1800 cd/m$^2$ at AC power of 32 Vrms. The brightness of the luminous member may be controlled based on a direction and a magnitude of DC power for generating a residual polarization in the ferrodielectric layer 130.

Figure 24:
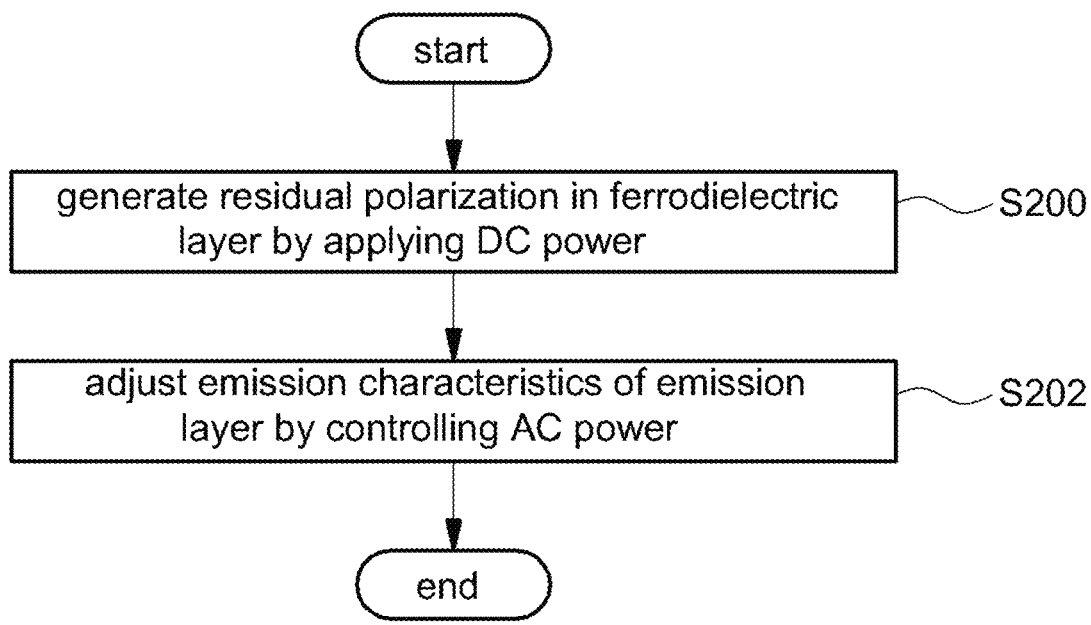
FIG. 24 is a flowchart showing a method of driving a luminous member according to another embodiment of the present disclosure.

FIG. 24 is a flowchart showing a method of driving a luminous member according to another embodiment of the present disclosure.

A residual polarization is generated in the ferrodielectric layer 130 by applying DC power to the luminous member (operation S200). When DC power for generating the residual polarization is applied between the first electrode 110 and the second electrode 120 of the luminous member, polarization is generated in the ferrodielectric layer 130 of the luminous member based on an electric field direction and magnitude of the DC power. A portion of the generated polarization remains in the ferrodielectric layer 130 according to the electric field direction and the magnitude of the DC power, even when the applied DC power is removed. The polarization remaining in the ferrodielectric layer 130 according to the electric field direction and magnitude of the DC power has nonvolatile built-in potential according to polarity and magnitude of the polarization.

After operation S200, the emission characteristic of the emission layer 140 is adjusted by controlling AC power applied to the luminous member based on polarity or magnitude of the residual polarization generated in the ferrodielectric layer 130 (operation S202). When AC power is applied between the first electrode 110 and the second electrode 120, light is emitted as electrons and holes are combined with each other by an electric field formed in the emission layer 140. Furthermore, when the carrier injecting layer 150 for injecting field induced carriers into the emission layer 140 is disposed between the emission layer 140 of the luminous member and the ferrodielectric layer 130, field induced carriers of the carrier injecting layer 150 move to the emission layer 140 based on the AC power and the residual polarization and, at the same time, direct carriers (e.g., electrons) are injected into the emission layer 140. As a result, light is emitted due to recombination of excitons including electrons and holes.

When the AC power is applied, the number of field induced carriers (not shown) injected from the carrier injecting layer 150 to the emission layer 140 may be controlled based on the polarity and the magnitude of the residual polarization generated in the ferrodielectric layer 130 and an electric field corresponding to the AC power. As the number of field induced carriers injected from the carrier injecting layer 150 to the emission layer 140 is controlled, the emission characteristics of the emission layer 140 may be controlled. Here, the emission characteristic may include brightness, intensity, and contrast of light.

Figure 25:
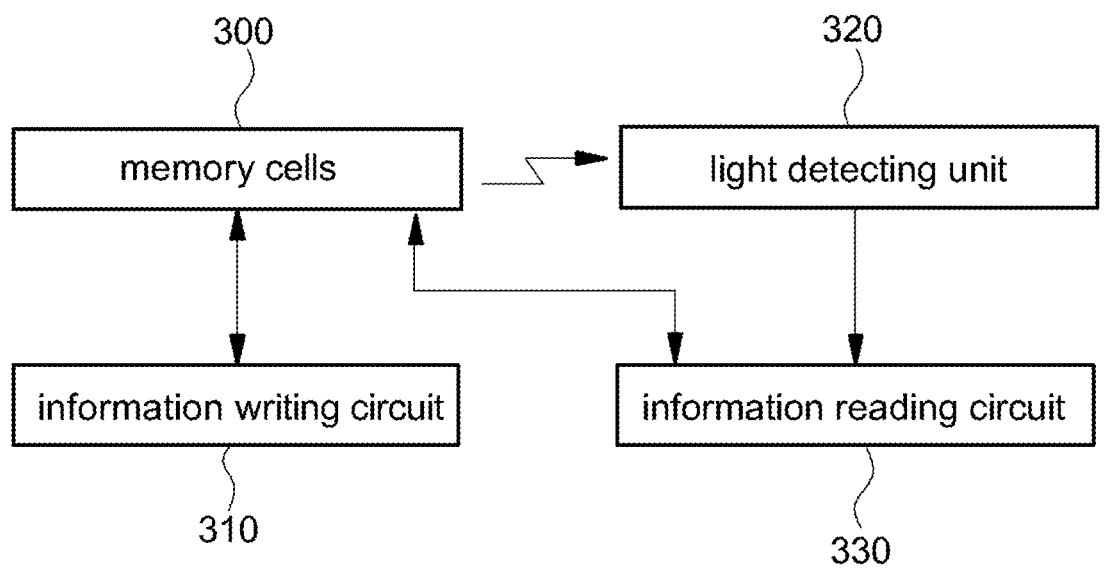
FIG. 25 is a block diagram showing a nonvolatile memory device according to another embodiment of the present disclosure.

FIG. 25 is a block diagram showing a nonvolatile memory device according to another embodiment of the present disclosure. The non-volatile memory device may include memory cells 300, an information writing circuit 310, a light detecting unit 320, and an information reading circuit 330.

Each of the memory cells 300 includes the luminous member described above. The luminous member may include the first electrode 110, the second electrode 120, the ferrodielectric layer 130, and the emission layer 140 and may further include the carrier injecting layer 150 and the spacer 160 for a nano air gap. Since the detailed descriptions of the components of the luminous member are already given above, detailed descriptions thereof will be omitted.

The memory cells 300 constitute a matrix of non-volatile memory devices and may include electrodes for electrically selecting any one or more cells within the matrix. These electrodes are referred to as word lines or bit lines, and the first electrode 110 and the second electrode 120 described above may constitute a word line or a bit line.

The information writing circuit 310 may induce residual polarization in the ferrodielectric layer 130 of a selected first memory cell from among the memory cells 300, thereby writing predetermined information. The information writing circuit 310 induces a residual polarization by applying DC power to the selected first memory cell.

When the information writing circuit 310 selects a first memory cell by applying DC power to a word line and a bit line, an electric field is formed by the DC power in the selected first memory cell, and the electric field generates a polarization in the ferrodielectric layer 130 constituting the first memory cell. Even when the DC power is removed, the generated polarization state may remain as the residual polarization, and such non-volatile residual polarization may be written as information. The information writing circuit 310 may generate a controlled polarization state regarding the selected first memory cell from among the memory cells 300 by determining a direction and a magnitude of DC power and may control writing of information corresponding to the polarization state.

The light detecting unit 320 converts emission characteristics of the each luminous member of the memory cells 300 into an electric signal. When light is emitted from each of the emission layers 140 constituting the memory cells 300, the light detecting unit 310 detects emission characteristics of the memory cells 300 by using a photoelectric effect, such as a photoelectron emission effect, a photovoltaic effect, a photoconductive effect, or an electric field emission effect, converts the detected emission characteristics into electric signals, and transmit the electric signals to the information reading circuit 330. The light detecting unit 310 may include a photodiode, a photocoupler, a photointerrupter, a phototransistor, a photothyristor, a charge-coupled device (CCD), a complementary metal-oxide semiconductor (CMOS), or the like, in order to detecting light emitted from each of the memory cells 300.

The information reading circuit 330 reads out information from an electric signal of the first memory cell whose emission characteristic is converted based on light detected by the light detecting unit 320 from among the memory cells 300. The information reading circuit 330 reads out information of the second memory cell by applying AC power to the first memory cell. When the information reading circuit 330 selects the first memory cell by applying the AC power to a word line and a bit line, the emission layer 140 constituting the second memory cell emits light due to the AC power applied to the selected first memory cell. In other words, when AC power is applied to the second memory cell in which the residual polarization is formed, direct carriers (e.g., electrons) and field induced carriers (e.g., holes) are injected into the emission layer 140. Therefore, light is emitted by the emission layer 140 as excitons including electrons and holes are recombined. When the emission layer 140 emits light, the light detecting unit 320 detects the emission characteristics of the emission layer 140, converts the detected emission characteristics into electric signals, and transmits the electric signals to the information reading circuit 330. The information reading circuit 330 may read information from the electric signals received from the light detecting unit 320.

Figure 26:
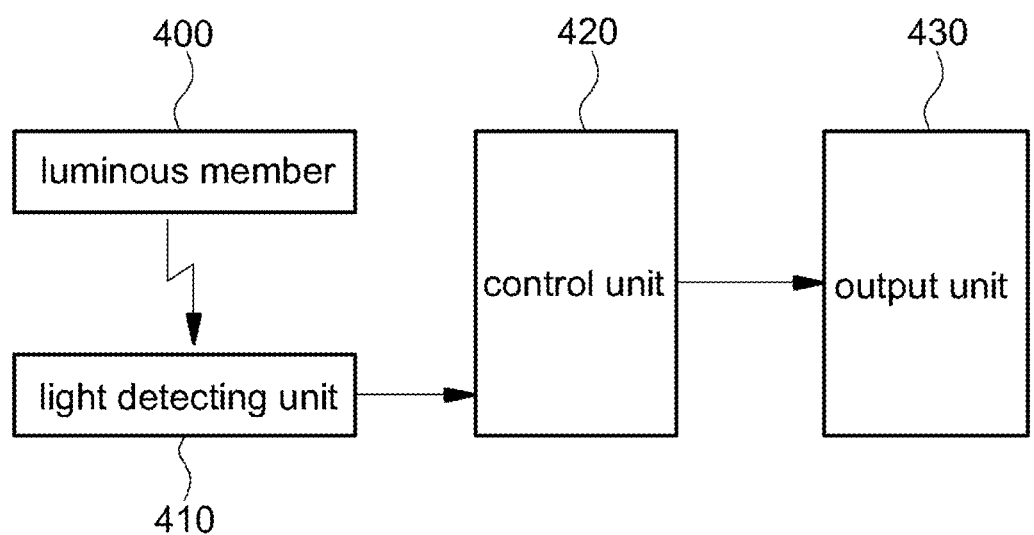
FIG. 26 is a block diagram showing a sensor according to another embodiment of the present disclosure.

FIG. 26 is a block diagram showing a sensor according to another embodiment of the present disclosure, and the sensor may include a luminous member 400, a light detecting unit 410, a control unit 420, and an output unit 430.

The luminous member 400 may include the first electrode 110, the second electrode 120, the ferrodielectric layer 130, and the emission layer 140 and may further include the carrier injecting layer 150 and the spacer 160 for a nano air gap. Since the detailed descriptions of the components of the luminous member 400 are already given above, detailed descriptions thereof will be omitted.

The light detecting unit 410 detects the emission characteristics of light emitted from the luminous member 400. Since the detailed description of the light detecting unit 410 is already given above, detailed description thereof will be omitted.

The control unit 420 detects a change in the emission characteristic according to a detection result of the light detecting unit 310 and controls output of an event signal according to the change in the emission characteristic. The control unit 420 periodically or non-periodically detects a change in the emission characteristic detected by the light detecting unit 410. When a change in the emission characteristic is out of a certain critical range as compared to pre-set or stored reference information, the control unit 420 generates an anomaly detection signal as an event signal and controls output of the generated anomaly detection signal. Furthermore, the control unit 420 may control to output information regarding a change in the emission characteristic, that is, an emission characteristic detection signal as an event signal. The reference information for detecting a change in emission characteristics may be stored in a memory provided in the control unit 420 or in a separate storage space.

The output unit 430 outputs an event signal under the control of the control unit 420. In an example, the event signal may be a light detection signal indicating that light emission of the luminous member 400 may be detected or an anomaly detection signal indicating that an abnormal signal is detected at the luminous member 400. Here, the anomaly detection signal may be, for example, a signal indicating an abnormal change in emission characteristics caused by a residual polarization newly induced due to introduction of an overcurrent, or by a change of previously built residual polarization. In order to output an event signal, the output unit 430 may include a display output module, an audio output module, a vibration output module, etc.

Figure 27:
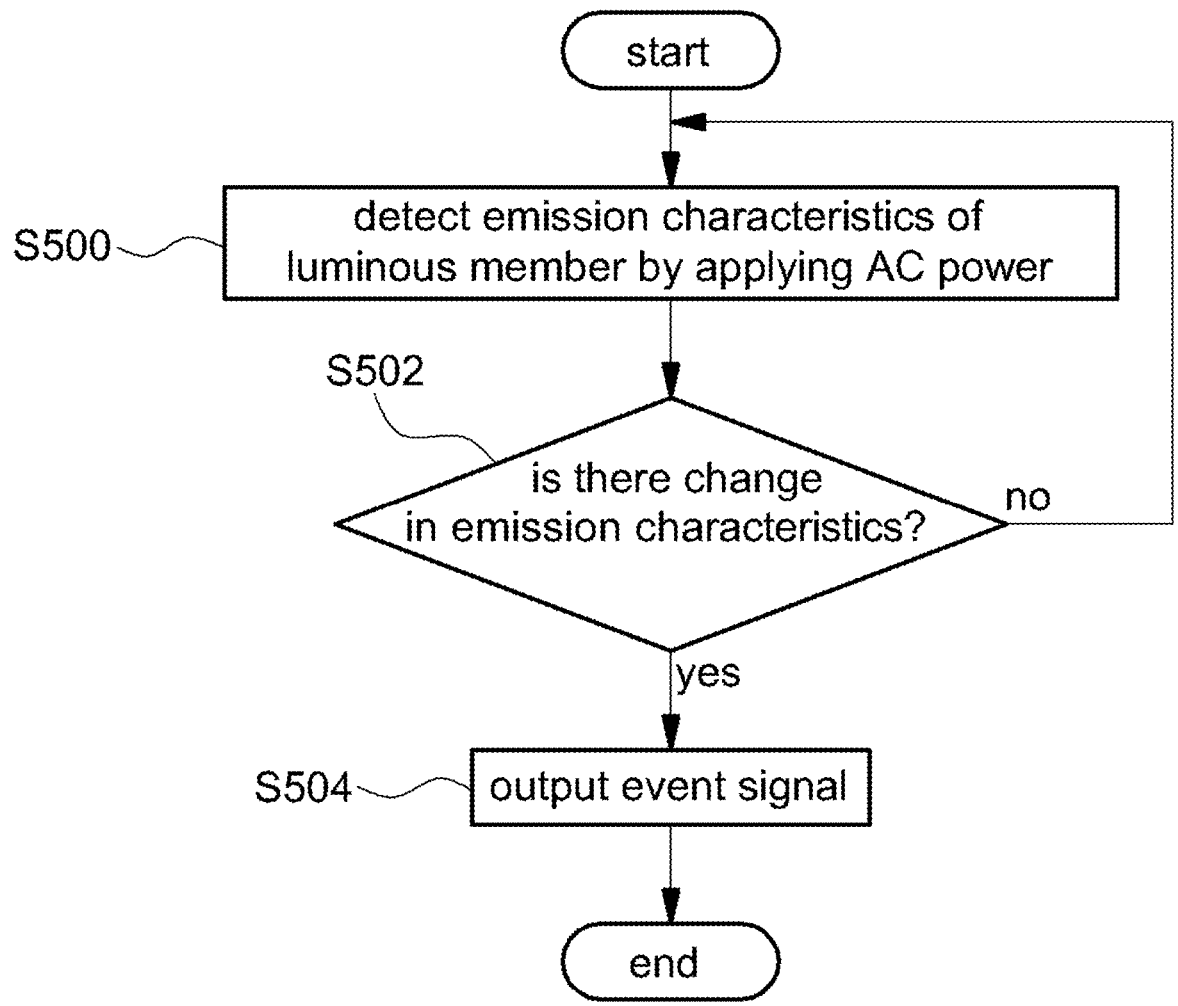
FIG. 27 is a flowchart for describing a method of driving a sensor according to another embodiment of the present disclosure.

FIG. 27 is a flowchart for describing a method of driving a sensor according to another embodiment of the present disclosure.

In a reference state corresponding to at least one of a first state in which a residual polarization is formed in the ferrodielectric layer 130 and a second state in which no residual polarization is formed, the emission characteristics of the luminous member 400 is detected by applying the AC power between the first electrode 110 and the second electrode 120 (operation S500). When light is emitted from the emission layer 140 of the luminous member due to the application of the AC power, a light detecting unit 410 of a sensor detects the emission characteristics by using a photoelectric effect, such as a photoelectron radiation effect, a photovoltaic effect, a photoconductive effect, or an electric field mission effect.

After operation S500, it is determined whether a change occurs in the emission characteristics of the luminous member (operation S502). The control unit 420 of the sensor periodically or non-periodically detects a change in the emission characteristics detected by the light detecting unit 410. When a change in the emission characteristic is out of a certain critical range as compared to pre-set or stored reference information, the control unit 420 generates an anomaly detection signal as an event signal. Furthermore, the control unit 420 may generate a light detection signal.

When a change in the emission characteristic is detected after operation S502, an event signal corresponding to the change of the emission characteristic is output (operation S504). The output unit 430 of the sensor may output a light detection signal indicating that the luminous member 400 is detected as an event signal or an anomaly detection signal indicating that an abnormal signal is detected in the luminous member 400.

Figure 28:
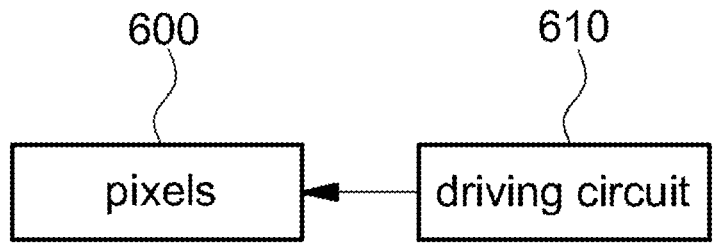
FIG. 28 is a block diagram for describing a display device according to another embodiment of the present disclosure.

FIG. 28 is a block diagram for describing a display device according to another embodiment of the present disclosure, and the display device may include pixels 600 and a driving circuit 610.

Each of the pixels 600 may each include the luminous member as described above. The pixels 600 may have a matrix array structure in which luminous members are two-dimensionally arranged. The pixels 600 may include a plurality of first electrodes extending in a first direction parallel to the plane of the matrix array and a plurality of second electrodes parallel in a second direction perpendicular to the first direction and parallel to the plane of the matrix array.

The driving circuit 610 controls display information based on residual polarization of the ferrodielectric layer 130 included in a selected pixel from among the pixels 600. The driving circuit 610 may generate a residual polarization in the ferrodielectric layer 130 by applying DC power to the pixels 600 having a matrix array structure. Furthermore, the driving circuit 610 applies AC power to a selected pixel from among the pixels 600. Here, the driving circuit 610 may control output of display information regarding the selected pixel by controlling the AC power applied to the selected pixel based on the polarity and the magnitude of the residual polarization. Here, the display information that may be controlled by the driving circuit 610 may be emission characteristics including light brightness, light intensity, and contrast of light.

Meanwhile, the display device may include a structure capable of expressing different colors for respective pixels. To this end, the pixels 600 may include emission layers of different colors, respectively.

Figure 29:
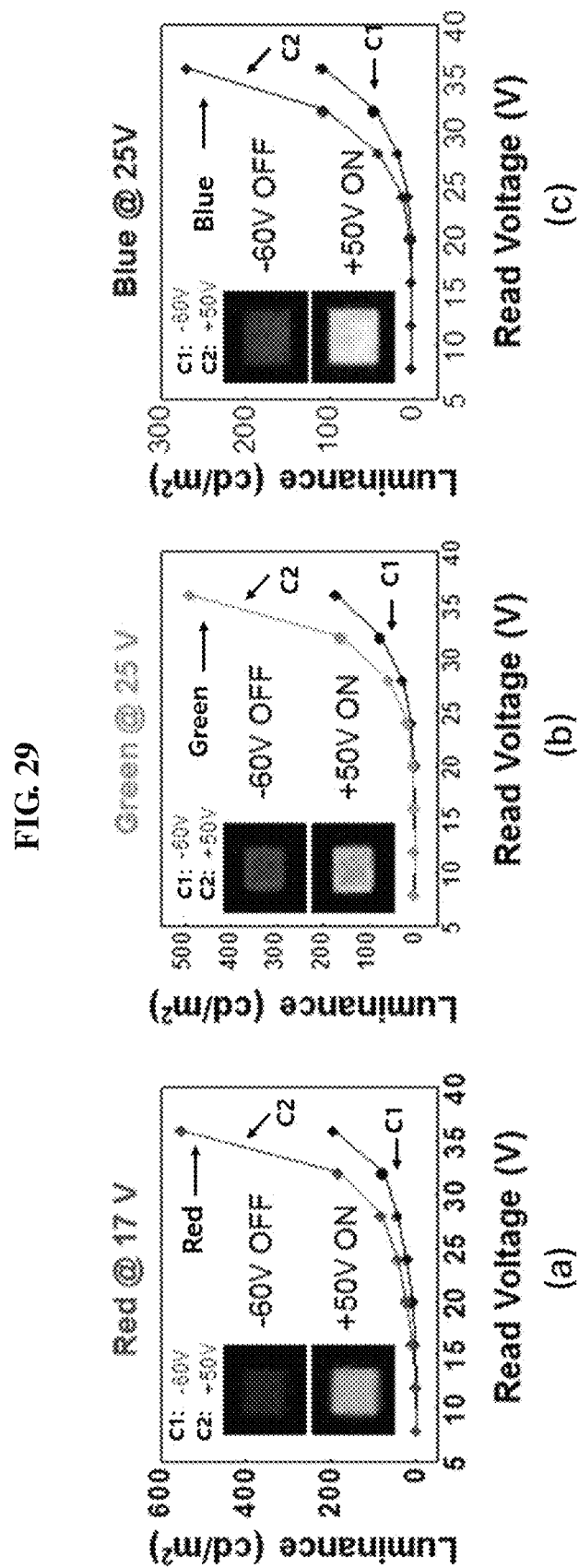
FIG. 29 is a reference diagram for describing color expression of the display device shown in FIG. 28.

FIG. 29 is a reference diagram for describing color expression of the display device shown in FIG. 28. FIG. 29A shows expression of red (R) color in respective luminous members in which the two types of residual polarizations are generated, FIG. 29B shows expression of green (G) color in respective luminous members in which the two types of residual polarizations are generated, and FIG. 29C shows expression of blue (B) color in respective luminous members in which the two types of residual polarizations are generated. As shown in FIG. 29A, FIG. 29B and FIG. 29C, light emissions of red, green and blue are implemented respectively by an R emission layer, a G emission layer, and a B emission layer, and may be obtained by applying AC power to pixels having residual polarizations induced by DC powers of for example, +50V or −60V. Brightness, intensity, and contrast of pixels may depend on the AC powers and frequencies of the AC powers applied to the R emission layer, the G emission layer, and the B emission layer.

The R emission layer, the G emission layer, and the B emission layer may be formed by using phosphors of colors R, G, and B, respectively. Furthermore, the R emission layer, the G emission layer, and the B emission layer may be formed by stacking R, G, and B color filters on white emission layers or by stacking R and G color filters on blue emission layers.

According to an embodiment of the present disclosure, there is provided a luminous member capable of easily adjusting emission characteristics of an emission layer by controlling of a power signal applied to the emission layer due to a residual polarization of a ferrodielectric layer in a luminous member.

According to an embodiment of the present disclosure, since the emission characteristics of the emission layer are changed according to the residual polarization of the ferrodielectric layer, a nonvolatile memory device may be provided that may be easily programmed and exhibits improved data retention.

According to an embodiment of the present disclosure, there is provided a sensor capable of detecting factors inducing residual polarization of the ferrodielectric layer by detecting a change in the emission characteristics of the emission layer according to the residual polarization of the ferrodielectric layer.

Furthermore, according to an embodiment of the present disclosure, a display device capable of providing various operation modes by controlling the emission characteristics of the emission layer according to the residual polarization of the ferrodielectric layer may be provided.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A luminous member comprising:
a first electrode;
a second electrode facing the first electrode;
an emission layer disposed on a main surface of the first electrode, the emission layer emits light by AC power applied between the first electrode and the second electrode; and
a ferrodielectric layer disposed between the emission layer and the second electrode including a residual polarization induced by applied DC power between the first electrode and the second electrode of the luminous member,
wherein an electric field formed by the AC power in the emission layer is controlled based on polarity or magnitude of the residual polarization induced in the ferrodielectric layer, thereby adjusting emission characteristics of the emission layer.

2. The luminous member of claim 1, further comprising a carrier injecting layer disposed between the emission layer and the ferrodielectric layer, the carrier injecting layer injects field induced carriers to the emission layer.

3. The luminous member of claim 1, wherein the first electrode injects direct carriers to the emission layer.

4. The luminous member of claim 1, wherein the ferrodielectric layer comprises at least one of polyvinylidene fluoride (PVDF), copolymers of vinylidene fluoride and ethylene trifluoride, P(VDF-TrFE), copolymers of vinylidene cyanide and vinyl acetate (VDCN-VAc), nylon-11, polyurea-9, polyvinylchloride (PVC), polyacrylonitrile (PAN), poly(phthalazinone ether nitrile) (PPEN), barium tantalate, yttruum oxide, barium titanate, tantalum oxide, titanic acid strontium, and zirconium oxide may be employed.

5. The luminous member of claim 1, wherein the emission layer comprises at least one of zinc sulfide, calcium sulfide, calcium selenium sulfide, calcium sulfide yttrium, calcium sulfide strontium, strontium sulfide yttrium, calcium sulfide magnesium, zinc sulfide magnesium, strontium sulfide, calcium sulfide aluminum, calcium gallium sulfide, aluminum sulfide barium magnesium, aluminum sulfide barium, cyanoethyl cellulose, and polyvinylidene fluoride that is doped with at least one of magnesium, europium, samarium, chlorine, manganese, cerium, terbium, fluorine, gadolinium, thulium, copper, silver, and lead.

6. The luminous member of claim 1, wherein at least one of the first electrode and the second electrode is formed of indium tin oxide (ITO), carbon nanotube (CNT), graphene, silver (Ag) nanowire, a metal mesh, or PEDOT:PSS.

7. The luminous member of claim 1, further comprising:
a spacer interposed between the first electrode and the emission layer, and
a nano air gap is formed between the first electrode and the emission layer due to the spacer.

8. A method of driving a luminous member,
wherein the luminous member comprising:
a first electrode;
a second electrode facing the first electrode;

an emission layer disposed on a main surface of the first electrode, the emission layer emits light by AC power applied between the first electrode and the second electrode; and a ferrodielectric layer disposed between the emission layer and the second electrode, wherein the AC power applied to the luminous member is controlled based on polarity or magnitude of a residual polarization generated in the ferrodielectric layer, thereby adjusting emission characteristics of the emission layer, wherein the method comprising:

generating a residual polarization in the ferrodielectric layer by applying DC power to the luminous member; and controlling the AC power applied to the luminous member based on polarity or magnitude of the residual polarization induced in the ferrodielectric layer, thereby adjusting emission characteristics of the emission layer.

9. The method of claim 8, wherein a carrier injecting layer for injecting field induced carriers to the emission layer is disposed between the emission layer and the ferrodielectric layer of the luminous member.

10. A non-volatile memory device comprising:
memory cells, each of which comprises a luminous member,
wherein the luminous member comprising:
a first electrode;
a second electrode facing the first electrode;
an emission layer disposed on a main surface of the first electrode, the emission layer emits light by AC power applied between the first electrode and the second electrode; and
a ferrodielectric layer disposed between the emission layer and the second electrode,
wherein the AC power applied to the luminous member is controlled based on polarity or magnitude of a residual polarization generated in the ferrodielectric layer, thereby adjusting emission characteristics of the emission layer;
an information writing circuit, which generates a residual polarization in the ferrodielectric layer of a first memory cell selected from among the memory cells and writes information;
a light detecting unit converting emission characteristics of the luminous members of the respective memory cells into electric signals; and
an information reading circuit, which reads out information from an electric signal of the first memory cell, the electric signal converted from the emission characteristics based on light detection of the light detecting unit.

11. The non-volatile memory device of claim 10,
wherein the information writing circuit induce the residual polarization by applying DC power to the first memory cell, and
wherein the information reading circuit reads out information of the second memory cell by applying AC power to the first memory cell.

12. A sensor comprising:
a luminous member,
wherein the luminous member comprising:
a first electrode;
a second electrode facing the first electrode;

an emission layer disposed on a main surface of the first electrode, the emission layer emits light by AC power applied between the first electrode and the second electrode; and
a ferrodielectric layer disposed between the emission layer and the second electrode including a residual polarization induced by applied DC power between the first electrode and the second electrode of the luminous member,
wherein an electric field formed by the AC power in the emission layer is controlled based on polarity or magnitude of a residual polarization induced in the ferrodielectric layer, thereby adjusting emission characteristics of the emission layer;
a light detecting unit, which detects emission characteristics of light emitted by the luminous member;
a control unit, which detects a change in the emission characteristics based on a detection result of the light detecting unit and controls output of an event signal based on the change of the emission characteristics; and
an output unit, which outputs the event signal under the control of the control unit.

13. A method of driving a sensor,
wherein the sensor comprising:
a luminous member;
wherein the luminous member comprising:
a first electrode;
a second electrode facing the first electrode;
an emission layer disposed on a main surface of the first electrode, the emission layer emits light by AC power applied between the first electrode and the second electrode; and
a ferrodielectric layer disposed between the emission layer and the second electrode,
wherein the AC power applied to the luminous member is controlled based on polarity or magnitude of a residual polarization generated in the ferrodielectric layer, thereby adjusting emission characteristics of the emission layer;
a light detecting unit, which detects emission characteristics of light emitted by the luminous member;
a control unit, which detects a change in the emission characteristics based on a detection result of the light detecting unit and controls output of an event signal based on the change of the emission characteristics; and
an output unit, which outputs the event signal under the control of the control unit,
wherein the method comprising:
in a reference state corresponding to at least one of a first state in which the residual polarization is formed in the ferrodielectric layer and a second state in which no residual polarization is formed, detecting the emission characteristics of the luminous member by applying AC power between the first electrode and the second electrode;
determining whether there is a change in the emission characteristics; and,
when a change in the emission characteristics is detected, outputting an event signal based on the change in the emission characteristics.

14. A display device comprising:
pixels, each of which comprises a luminous member,
wherein the luminous member comprising:
a first electrode;
a second electrode facing the first electrode;

an emission layer disposed on a main surface of the first electrode, the emission layer emits light by AC power applied between the first electrode and the second electrode; and a ferrodielectric layer disposed between the emission layer and the second electrode, wherein the AC power applied to the luminous member is controlled based on polarity or magnitude of a residual polarization generated in the ferrodielectric layer, thereby adjusting emission characteristics of the emission layer; and a driving circuit, which controls display information based on a residual polarization of the ferrodielectric layer included in a pixel selected from among the pixels.

15. The display device of claim 14, wherein the pixels constitute a matrix array structure in which the pixels are arranged in horizontal directions and vertical directions.

16. The display device of claim 14, wherein the luminous member further comprising a carrier injecting layer disposed between the emission layer and the ferrodielectric layer, the carrier injecting layer injects field induced carriers to the emission layer.

17. The display device of claim 14, wherein the first electrode of the luminous member injects direct carriers to the emission layer.

18. The display device of claim 14, wherein the ferrodielectric layer of the luminous member comprises at least one of polyvinylidene fluoride (PVDF), copolymers of vinylidene fluoride and ethylene trifluoride, P(VDF-TrFE), copolymers of vinylidene cyanide and vinyl acetate (VDCN-VAc), nylon-11, polyurea-9, polyvinylchloride (PVC), polyacrylonitrile (PAN), poly(phthalazinone ether nitrile) (PPEN), barium tantalate, yttruum oxide, barium titanate, tantalum oxide, titanic acid strontium, and zirconium oxide may be employed.

19. The display device of claim 14, wherein the emission layer of the luminous member comprises at least one of zinc sulfide, calcium sulfide, calcium selenium sulfide, calcium sulfide yttrium, calcium sulfide strontium, strontium sulfide yttrium, calcium sulfide magnesium, zinc sulfide magnesium, strontium sulfide, calcium sulfide aluminum, calcium gallium sulfide, aluminum sulfide barium magnesium, aluminum sulfide barium, cyanoethyl cellulose, and polyvinylidene fluoride that is doped with at least one of magnesium, europium, samarium, chlorine, manganese, cerium, terbium, fluorine, gadolinium, thulium, copper, silver, and lead.

20. The display device of claim 14, wherein at least one of the first electrode and the second electrode of the luminous member is formed of indium tin oxide (ITO), carbon nanotube (CNT), graphene, silver (Ag) nanowire, a metal mesh, or PEDOT:PSS.

* * * * *